United States Patent
Kim et al.

(10) Patent No.: US 10,546,875 B2
(45) Date of Patent: Jan. 28, 2020

(54) SEMICONDUCTOR MEMORY DEVICE INCLUDING A CAPACITOR

(71) Applicant: SAMSUNG ELECTRONICS CO., LTD., Suwon-si, Gyeonggi-Do (KR)

(72) Inventors: Chanho Kim, Seoul (KR); Pansuk Kwak, Seoul (KR); Chaehoon Kim, Suwon-si (KR); Hongsoo Jeon, Suwon-si (KR); Jeunghwan Park, Suwon-si (KR); Bongsoon Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/996,483

(22) Filed: Jun. 3, 2018

(65) Prior Publication Data
US 2019/0157292 A1 May 23, 2019

(30) Foreign Application Priority Data
Nov. 20, 2017 (KR) ......................... 10-2017-0155160

(51) Int. Cl.
| | |
|---|---|
| H01L 27/11 | (2006.01) |
| H01L 27/11582 | (2017.01) |
| G11C 16/04 | (2006.01) |
| G11C 16/24 | (2006.01) |
| H01L 27/1157 | (2017.01) |
| G11C 16/08 | (2006.01) |

(52) U.S. Cl.
CPC .... *H01L 27/11582* (2013.01); *G11C 16/0483* (2013.01); *G11C 16/24* (2013.01); *H01L 27/1157* (2013.01); *G11C 16/08* (2013.01)

(58) Field of Classification Search
CPC ......... H01L 27/11582; H01L 27/11568; H01L 27/11573; H01L 28/40; H01L 23/528; H01L 23/53271; H01L 23/5329; H01L 21/76897; G11C 16/10; G11C 16/26; G11C 16/0483
See application file for complete search history.

(56) References Cited

U.S. PATENT DOCUMENTS

| | | | |
|---|---|---|---|
| 7,679,133 B2 | 3/2010 | Son et al. | |
| 7,910,973 B2 | 3/2011 | Sakaguchi et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,743,611 B2 | 6/2014 | Hioka | |
| 8,811,079 B2 | 8/2014 | Fukuda et al. | |

(Continued)

FOREIGN PATENT DOCUMENTS

KR 10-1410797 B1 6/2014

*Primary Examiner* — Vanthu T Nguyen
(74) *Attorney, Agent, or Firm* — Volentine, Whitt & Francos, PLLC

(57) ABSTRACT

At least one latch of a page buffer of a nonvolatile memory device includes a capacitor that selectively stores a voltage of a sensing node. The capacitor includes at least one first contact having a second height corresponding to a first height of each of cell strings, and at least one second contact to which a ground voltage is supplied. The at least one second contact has a third height corresponding to the first height, disposed adjacent to the at least one first contact, and electrically separated from the at least one first contact.

11 Claims, 16 Drawing Sheets

(56) References Cited

U.S. PATENT DOCUMENTS

| | | |
|---|---|---|
| 9,007,850 B2 | 4/2015 | Joo et al. |
| 9,070,434 B2 | 6/2015 | Hioka et al. |
| 9,659,954 B2 | 5/2017 | Kim et al. |
| 9,716,137 B1 | 7/2017 | Hu et al. |
| 10,049,747 B2 * | 8/2018 | Yano ................ G11C 16/10 |
| 2011/0233648 A1 | 9/2011 | Seal et al. |
| 2017/0053932 A1 * | 2/2017 | Jeon ................ H01L 27/11582 |

* cited by examiner

SEMICONDUCTOR MEMORY DEVICE INCLUDING A CAPACITOR

CROSS-REFERENCE TO RELATED APPLICATIONS

A claim of priority under 35 U.S.C. § 119 is made to Korean Patent Application No. 10-2017-0155160 filed Nov. 20, 2017, in the Korean Intellectual Property Office, the entire content of which is hereby incorporated by reference.

BACKGROUND

The present inventive concepts herein relate to a semiconductor circuit, and more particularly relate to a nonvolatile memory device including a capacitor.

As semiconductor manufacturing technologies have developed, the degree of integration of semiconductor memory has consequently improved. In particular, the degree of integration of semiconductor memory has sharply improved as manufacturing of three-dimensional semiconductor memory has developed. Three-dimensional semiconductor memory may include nonvolatile memory such as for example flash memory, phase change memory (PRAM), ferroelectric memory (FRAM), or resistive memory (RRAM).

Semiconductor memory typically includes a core region where memory cells are disposed, and a peripheral region where peripheral circuits for accessing the memory cells are disposed. As the memory cells are stacked higher in a three-dimensional structure, a difference between the height of the core region and the height of the peripheral region has increased. As the difference in height between the core region and the peripheral region has increased, unusable space in the peripheral region has consequently increased.

SUMMARY

Embodiments of the inventive concepts provide a semiconductor memory including a capacitor formed as based on a height difference between a core region and a peripheral region, which occurs as memory cells are stacked in a three-dimensional structure.

Embodiments of the inventive concepts provide a nonvolatile memory device that includes a memory cell array formed in a first area of a substrate, and a page buffer circuit formed in a second area of the substrate and connected to the memory cell array through bit lines. The memory cell array includes cell strings, each of the cell strings including nonvolatile memory cells stacked in a direction perpendicular to the substrate. The page buffer circuit includes page buffers respectively corresponding to the bit lines. Each of the page buffers includes latches connected to a sensing node, and a selection circuit configured to selectively connect the sensing node to the corresponding bit line of the bit lines. At least one latch of the latches includes a capacitor configured to selectively store a voltage of the sensing node. The capacitor includes at least one first contact to which the voltage of the sensing node is selectively supplied, the at least one first contact having a second height corresponding to a first height of each of the cell strings; and at least one second contact to which a ground voltage is supplied, the at least one second contact having a third height corresponding to the first height, disposed adjacent to the at least one first contact, and electrically separated from the at least one first contact.

Embodiments of the inventive concepts further provide a nonvolatile memory device that includes a memory cell array formed in a first area of a substrate, and a page buffer circuit formed in a second area of the substrate and connected to the memory cell array through bit lines. The memory cell array includes cell strings, each of the cell strings including nonvolatile memory cells stacked in a direction perpendicular to the substrate. The page buffer circuit includes page buffers respectively corresponding to the bit lines. Each of the page buffers includes latches connected to a sensing node, a selection circuit configured to selectively connect the sensing node to the corresponding bit line of the bit lines, and a capacitor connected to the sensing node. The capacitor includes at least one first contact to which a sensing voltage of the sensing node is supplied, the at least one first contact having a second height corresponding to a first height of each of the cell strings; and at least one second contact to which a ground voltage is supplied, the at least one second contact having a third height corresponding to the first height, disposed adjacent to the at least one first contact, and electrically separated from the at least one first contact.

Embodiments of the inventive concepts still further provide a nonvolatile memory device that includes a memory cell array formed in a first area of a substrate, and a page buffer circuit formed in a second area of the substrate and connected to the memory cell array through bit lines. The memory cell array includes cell strings, each of the cell strings including nonvolatile memory cells stacked in a direction perpendicular to the substrate. The page buffer circuit includes page buffers respectively corresponding to the bit lines. Each of the page buffers includes latches connected to a sensing node, a selection circuit configured to selectively connect the sensing node to the corresponding bit line of the bit lines, and a capacitor configured to provide a capacitance to each of the page buffers. The capacitor includes at least one first contact having a second height corresponding to a first height of each of the cell strings; and at least one second contact to which a ground voltage is supplied, the at least one second contact having a third height corresponding to the first height, disposed adjacent to the at least one first contact, and electrically separated from the at least one first contact.

BRIEF DESCRIPTION OF THE FIGURES

The above and other objects and features of the inventive concepts will become apparent in view of the following description taken with reference to the accompanying drawings.

DETAILED DESCRIPTION

Below, embodiments of the inventive concepts are described in detail and clearly to such an extent that one of ordinary skill in the art may easily implement the inventive concepts.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
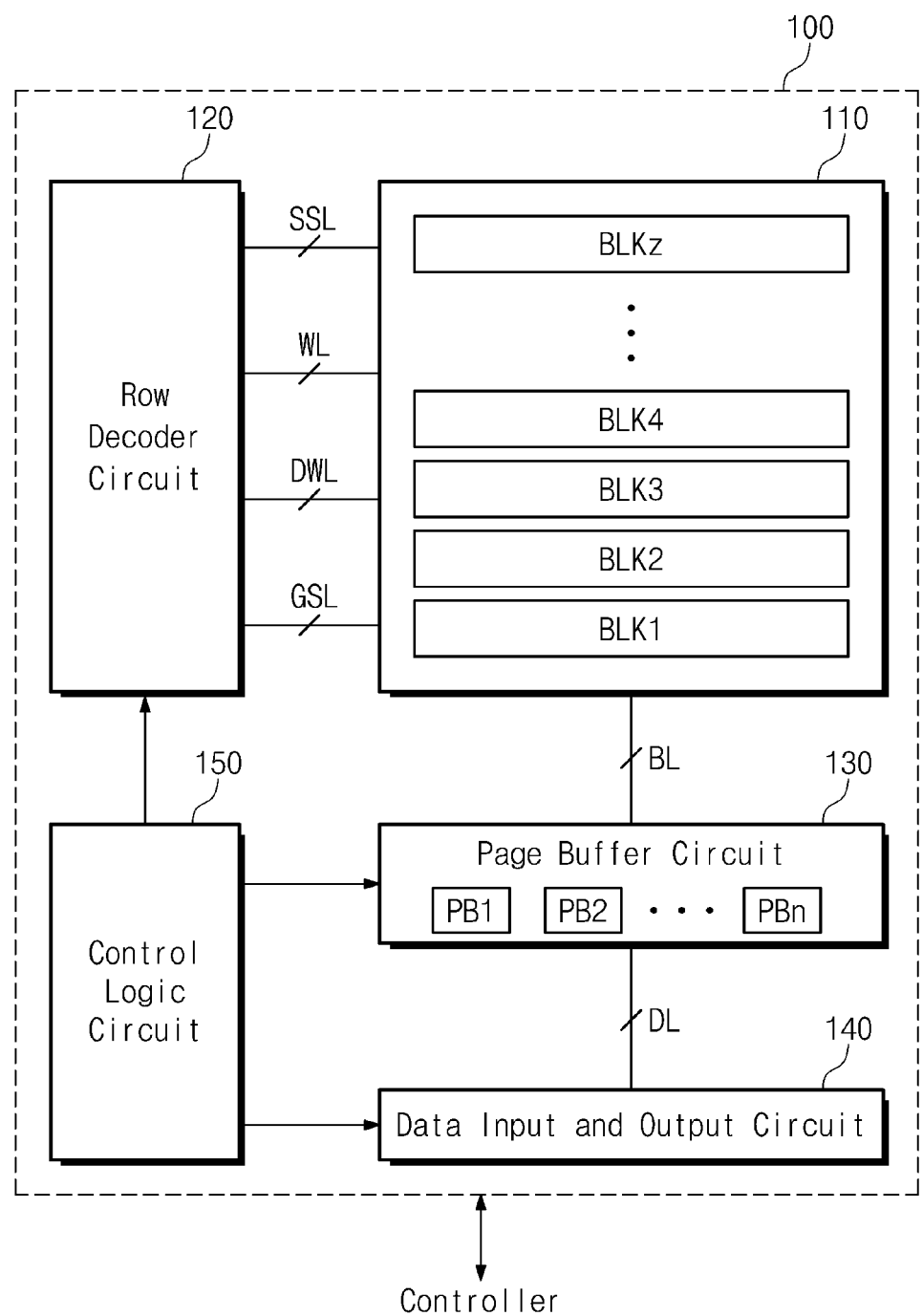
FIG. 1 illustrates a block diagram of a nonvolatile memory device according to an embodiment of the inventive concepts.

FIG. 1 illustrates a block diagram of a nonvolatile memory device 100 according to an embodiment of the inventive concepts. Referring to FIG. 1, the nonvolatile memory device 100 includes a memory cell array 110, a row decoder circuit 120, a page buffer circuit 130, a data input and output circuit 140, and a control logic circuit 150.

The memory cell array 110 includes a plurality of memory blocks BLK1 to BLKz. Each of the memory blocks BLK1 to BLKz includes a plurality of memory cells. Each of the memory blocks BLK1 to BLKz may be connected to the row decoder circuit 120 through at least one ground selection line GSL, at least one dummy word line DWL, a plurality of word lines WL, and at least one string selection line SSL.

Each of the memory blocks BLK1 to BLKz may be connected to the page buffer circuit 130 through a plurality of bit lines BL. The memory blocks BLK1 to BLKz may be connected in common to the bit lines BL. The memory cells of the memory blocks BLK1 to BLKz may have the same structure.

In an embodiment, each of the memory blocks BLK1 to BLKz may correspond to a unit of an erase operation. The memory cells of the memory cell array 110 may be erased for each memory block. The memory cells belonging to one memory block may be erased at the same time. As another example, each of the memory blocks BLK1 to BLKz may be divided into a plurality of sub-blocks. Each sub-block may correspond to a unit of an erase operation.

In an embodiment, each of the memory blocks BLK1 to BLKz may include a physical storage space which is identified by a block address. Each of the word lines WL may correspond to a physical storage space that is identified by a row address. Each of the bit lines BL may correspond to a physical storage space that is identified by a column address.

In an embodiment, each memory block may include a plurality of physical pages, each of which includes a plurality of memory cells. A physical page may refer to a unit of a program operation. Memory cells of each physical page may be simultaneously programmed Each physical page may include a plurality of logical pages.

Bits that are programmed in memory cells of each physical page may constitute logical pages. First bits that are programmed in memory cells of each physical page may constitute a first logical page. K-th bits (K being a positive integer) that are programmed in the memory cells of each physical page may constitute a k-th logical page.

The row decoder circuit 120 is connected to the memory cell array 110 through a plurality of ground selection lines GSL, a plurality of dummy word lines DWL, the plurality of word lines WL, and a plurality of string selection lines SSL. The row decoder circuit 120 operates under control of the control logic circuit 150.

The row decoder circuit 120 may decode an address that is received through an input/output channel from an external device (e.g., a controller not shown). The row decoder circuit 120 may control voltages to be applied to the string selection lines SSL, the dummy word lines DWL, the word lines WL, and the ground selection lines GSL based on a decoded address.

The page buffer circuit 130 is connected to the memory cell array 110 through the bit lines BL. The page buffer circuit 130 is connected with the data input and output circuit 140 through a plurality of data lines DL. The page buffer circuit 130 operates under control of the control logic circuit 150.

The page buffer circuit 130 includes a plurality of page buffers PB1 to PBn (n being an integer greater than "1") respectively corresponding to the plurality of bit lines BL. During a program operation, the page buffers PB1 to PBn may receive write data from the data input and output circuit 140.

The page buffers PB1 to PBn may store data to be written in memory cells and may apply voltages to the bit lines BL depending on the stored data, respectively. During a read operation, the page buffers PB1 to PBn may sense voltages of bit lines and may store the sensed result as read data. The page buffers PB1 to PBn may output the read data to the data input and output circuit 140.

The data input and output circuit 140 is connected with the page buffer circuit 130 through the data lines DL. The data input and output circuit 140 may output read data transferred from the page buffer circuit 130 to the controller through the input and output channel, and may transfer data received from the controller through the input and output channel to the page buffer circuit 130.

The control logic circuit 150 may receive a command through the input and output channel from the controller, and may receive a control signal through a control channel from the controller. The control logic circuit 150 may receive a command received through the input and output channel in response to the control signal, and may route an address received through the input and output channel to the row decoder circuit 120.

In response to the control signal, the control logic circuit 150 may route data received through the input and output channel to the data input and output circuit 140. The control logic circuit 150 may decode the received command and may control the nonvolatile memory device 100 based on the decoded command.

Figure 2:
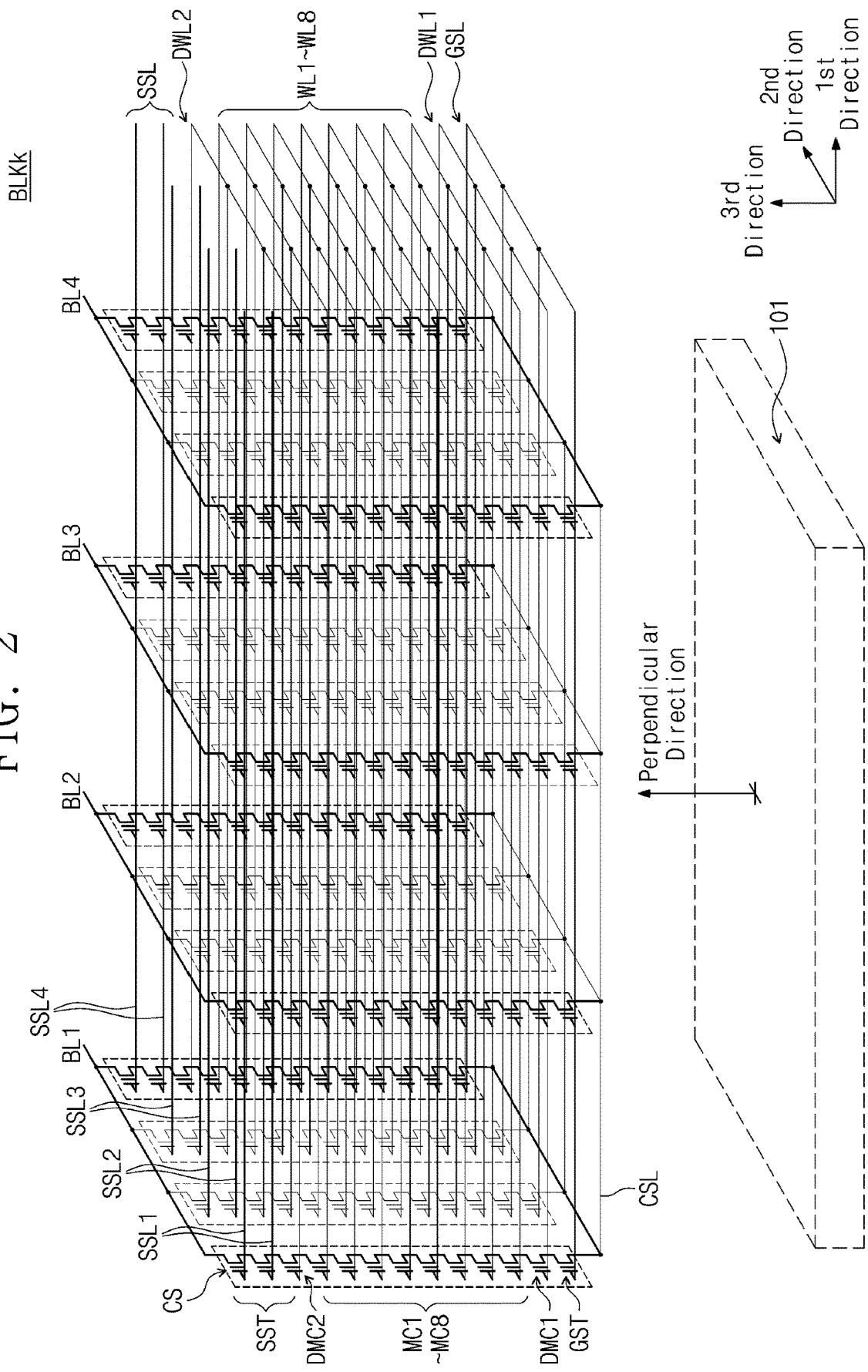
FIG. 2 illustrates a circuit diagram of one memory block among memory blocks of a memory cell array of FIG. 1.

FIG. 2 illustrates a circuit diagram of one memory block BLKk among the memory blocks BLK1 to BLKz of the memory cell array 110 of FIG. 1.

Figure 3:
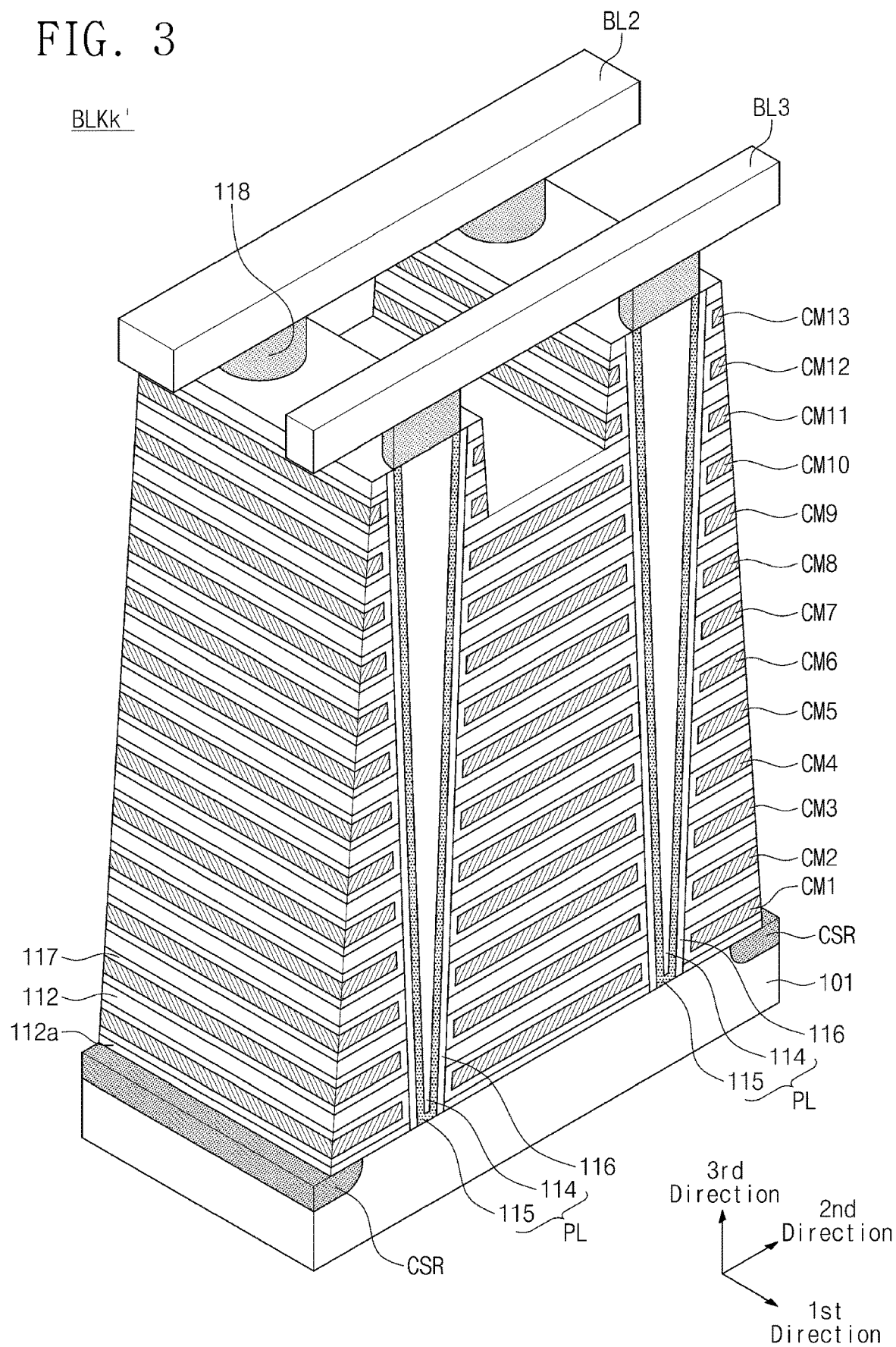
FIG. 3 illustrates a perspective sectional view of an example of a part of the memory block of FIG. 2.

FIG. 3 illustrates a perspective sectional view of an example of a part BLKk' of the memory block BLKk of FIG. 2. In an embodiment, a structure associated with two bit lines (e.g., BL2 and BL3) and two string selection lines in the memory block BLKk of FIG. 2 is illustrated in FIG. 3.

Referring to FIGS. 1 to 3, common source regions CSR that extend along a first direction and are spaced apart from each other along a second direction are provided on a substrate 101. The common source regions CSR may be connected in common to each other to form a common source line CSL. In an embodiment, the substrate 101 may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate 101 along a third direction perpendicular to the substrate 101. The insulating layers 112 and 112a may be spaced apart from each other along the third direction. In an embodiment, the insulating layers 112 and 112a may for example include silicon oxide or silicon nitride. In an embodiment, the thicknesses (e.g., a thicknesses of the third direction) of the insulating layer 112a, which is in contact with the substrate 101, from among the insulating layers 112 and 112a may be thinner than the thicknesses (e.g., a thicknesses of the third direction) of each of the remaining insulating layers 112.

Pillars PL that are disposed to be spaced apart from each other along the first direction and the second direction, and which penetrate the insulating layers 112 and 112a along the third direction, are provided between the common source regions CSR. In an embodiment, the pillars PL may be in contact with the substrate 101 through the insulating layers 112 and 112a. Each of the pillars PL may include an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more insulating layers (e.g., different insulating layers) such as a silicon oxide layer, a silicon nitride layer, and an aluminum oxide layer.

Between the common source regions CSR, second insulating layers 117 are provided on upper surfaces and lower surfaces of the insulating layers 112 and 112a, and exposed outer surfaces of the pillars PL. In an embodiment, the second insulating layers 117 may be removed from an upper surface of the uppermost insulating layer among the insulating layers 112 and 112a.

In each of the pillars PL, the first insulating layer 116 and the second insulating layer 117 may form an information storage layer when coupled adjacent to each other. For example, the first insulating layer 116 and the second insulating layer 117 may include an oxide-nitride-oxide (ONO) or oxide-nitride-aluminum (ONA). The first insulating layer 116 and the second insulating layer 117 may form a tunneling insulating layer, a charge trap layer, and a blocking insulating layer.

Between the common source regions CSR and between the insulating layers 112 and 112a, conductive materials CM1 to CM13 (i.e., CM1, CM2, CM3, CM4, CM5, CM6, CM7, CM8, CM9, CM10, CM11, CM12 and CM13) are provided on exposed outer surfaces of the second insulating layers 117. The conductive materials CM1 to CM13 may include a metallic conductive material. Drains 118 are provided on the pillars PL. In an embodiment, the drains 118 may include an N-type semiconductor material (e.g., silicon). In an embodiment, the drains 118 may be in contact with upper surfaces of the channel layers 115 of the pillars PL.

As shown in FIG. 3, the bit lines BL2 and BL3 that extend along the second direction and are spaced apart from each other along the first direction are provided on the drains 118. The bit lines BL2 and BL3 are connected with the drains 118. In an embodiment, the drains 118 and bit lines (e.g., BL2 and BL3) may be connected to each other through contact plugs. The bit lines BL2 to BL3 may include a metallic conductive material.

The pillars PL form cell strings CS together with the first and second insulating layers 116 and 117 and the conductive materials CM1 to CM13. Each of the pillars PL forms a cell string together with the first and second insulating layers 116 and 117 and the conductive materials CM1 to CM13. The first conductive material CM1 may form ground selection transistors GST together with the adjacent first and second insulating layers 116 and 117 and the channel layers 115. The first conductive material CM1 may extend along the first direction to form the ground selection line GSL.

The second conductive material CM2 may form first dummy memory cells DMC1 together with the adjacent first and second insulating layers 116 and 117 and the channel layers 115. The second conductive material CM2 may extend along the first direction to form a first dummy word line DWL1.

According to the above description, the third to tenth conductive material CM3 to CM10 may form first to eighth memory cells MC1 to MC8 together with the adjacent first and second insulating layers 116 and 117 and the channel layers 115. The third to tenth conductive material CM3 to CM10 may extend along the first direction to form first to eighth word lines WL1 to WL8.

The eleventh conductive material CM11 may form second dummy memory cells DMC2 together with the adjacent first and second insulating layers 116 and 117 and the channel layers 115. The eleventh conductive material CM11 may extend along the first direction to form a second dummy word line DWL2.

The twelfth conductive materials CM12 may form first to fourth string selection transistors SST (hereinafter referred to as "lower string selection transistors"), which are disposed above the eleventh conductive material CM11 on the substrate 101 side of the thirteenth conductive materials CM13 along the direction opposite the third direction, together with the adjacent first and second insulating layers 116 and 117 and the channel layers 115. The twelfth conductive materials CM12 may extend along the first direction to form first to fourth string selection lines SSL1 to SSL4 (hereinafter referred to as "lower string selection lines").

The thirteenth conductive materials CM13 may form first to fourth string selection transistors SST (hereinafter referred to as "upper string selection transistors"), which are adjacent to bit lines BL1 to BL4, together with the adjacent first and second insulating layers 116 and 117 and the channel layers 115. The thirteenth conductive materials CM13 may extend along the first direction to form first to fourth string selection lines SSL1 to SSL4 (hereinafter referred to as "upper string selection lines") close to the bit lines BL1 to BL4.

As the first to thirteenth conductive materials CM1 to CM13 are stacked along the third direction, in each cell string, the ground selection transistor GST, the first dummy memory cell DMC1, the memory cells MC1 to MC8, the second dummy memory cell DMC2, and the string selection transistors SST may be stacked along the third direction.

In each of the pillars PL, as the channel layer 15 is shared by the first to thirteenth conductive materials CM1 to CM13, in each cell string, the ground selection transistor GST, the first dummy memory cell DMC1, the memory cells MC1 to MC8, the second dummy memory cell DMC2, and the string selection transistor SST may be serially connected along the third direction.

As the first to eleventh conductive materials CM1 to CM11 are respectively connected in common, the ground selection line GSL, the first dummy word line DWL1, the first to eighth word lines WL1 to WL8, and the second dummy word line DWL2 may be viewed as respectively being connected in common in the cell strings CS. For example, as the first conductive material CM1 are connected in common, the ground selection line GSL in the cell strings CS may be viewed as connected in common. Similarly as a further example, as the eleventh conductive material CM11 are connected in common, the second dummy word line DWL2 in the cell strings CS may be viewed as connected in common.

As a height of the memory cell array 110 increases along the third direction by the addition of layers of conductive material similar to conductive materials CM1 to CM13 for example, a height of a layer where the bit lines BL1 to BL4 are formed with respect to the substrate 101 may increase. A height at which the bit lines BL1 to BL4 are formed influences a height at which metal interconnections of the nonvolatile memory device 100 are formed. For example, the height at which the metal interconnections are formed may be equal to or greater than the height at which the bit lines BL1 to BL4 are formed.

Unlike the memory cell array 110, a peripheral circuit (e.g., the row decoder circuit 120 or the page buffer circuit 130 of FIG. 1) of the memory cell array 110 does not have a stack structure. That is, if the height of the memory cell array 110 becomes increased or greater, a height of contacts connecting metal interconnections with elements (e.g., transistors formed in substrate 101) of the peripheral circuit (e.g., the row decoder circuit 120 or the page buffer circuit 130) becomes greater. In an embodiment, the memory block BLKk of the memory cell array 110 is formed in a first area of substrate 101, and the page buffer circuit 130 is formed in a second area of the substrate 101 different than the first area of the substrate 101.

As the height of the contacts becomes greater, capacitive coupling between the contacts (i.e., between adjacent contacts) increases. The inventive concepts are directed to providing a nonvolatile memory device that improves reliability by using a capacitor formed by the increased capacitive coupling between the adjacent contacts in the peripheral circuit (e.g., the row decoder circuit 120 or the page buffer circuit 130).

Figure 4:
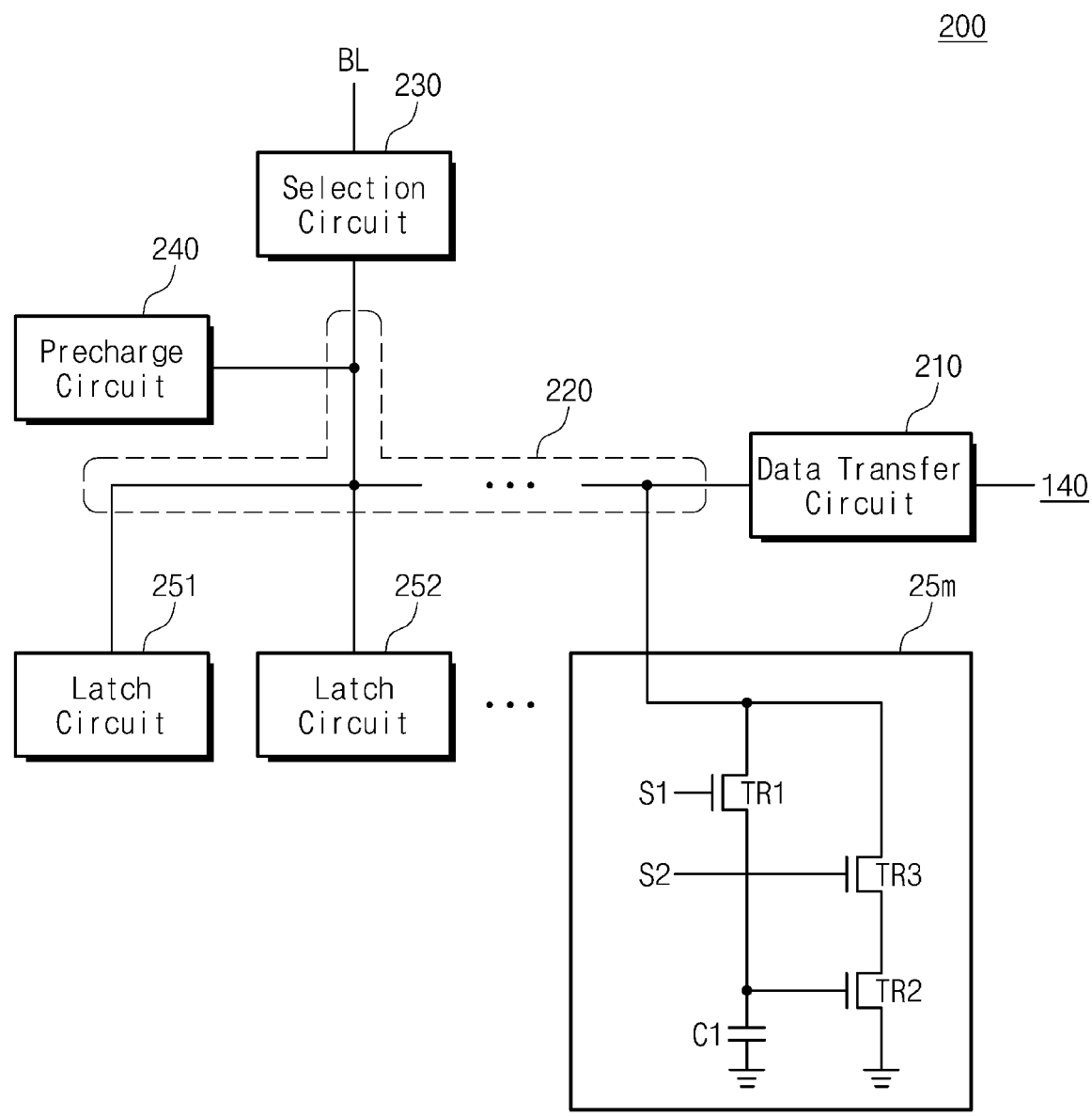
FIG. 4 illustrates an example of one page buffer among the page buffers of FIG. 1.

FIG. 4 illustrates an example of one page buffer 200 among the page buffers PB1 to PBn of FIG. 1. Referring to FIGS. 1 and 4, the page buffer 200 includes a data transfer circuit 210, a sensing node 220, a selection circuit 230, a precharge circuit 240, and latch circuits 251, 252 to 25m (m being a positive integer greater than "1").

The data transfer circuit 210 may operate under control of the control logic circuit 150. During a program operation, the data transfer circuit 210 may transfer data from the data input and output circuit 140 to the sensing node 220. During a read operation, the data transfer circuit 210 may transfer data stored at the sensing node 220 to the data input and output circuit 140.

The selection circuit 230 may operate under control of the control logic circuit 150. During the program operation or the read operation, the selection circuit 230 may connect the sensing node 220 with a relevant bit line BL. The precharge circuit 240 may operate under control of the control logic circuit 150. During the program operation or the read operation, the precharge circuit 240 may apply (or charge) a specific voltage to the sensing node 220 or the bit line BL.

The latch circuits 251 to 25m are connected to the sensing node 220. The latch circuits 251 to 25m may store data to be written in a memory cell through the bit line BL, or may store data read from a memory cell through the bit line BL. The latch circuits 251 to 25m may have the same structure or may have different structures.

In an embodiment, an example of the latch circuit 25m among the latch circuits 251 to 25m is illustrated in FIG. 4 in detail. The latch circuit 25m includes first to third transistors TR1 to TR3 and a first capacitor C1. The first transistor TR1 has a first end connected to the sensing node 220, and a second end connected to the first capacitor C1. A first signal S1 may be applied to a gate of the first transistor TR1.

The first capacitor C1 is connected between the second end of the first transistor TR1 and a ground node. The second transistor TR2 has a first end connected to a second end of the third transistor TR3, and a second end connected to the ground node. A gate of the second transistor TR2 is connected to the second end of the first transistor TR1.

The third transistor TR3 has a first end connected to the sensing node 220, and a second end connected to the first end of the second transistor TR2. A second signal S2 may be applied to a gate of the third transistor TR3. In an embodiment, the first and second signals S1 to S2 may be applied from the control logic circuit 150.

If the first transistor TR1 is turned on by the first signal S1, a level (e.g., a high level or a low level) of a voltage of the sensing node 220 may be stored in the first capacitor C1. The second transistor TR2 may be turned on or turned off by the voltage stored in the first capacitor C1.

If the third transistor TR3 is turned on by the second signal S2, a level or an inverted level (e.g., a high level or a low level) of the voltage stored in the first capacitor C1 may be transferred to the sensing node 220. That is, the first capacitor C1 may be used to store a voltage level (i.e., data) in the latch circuit 25m.

As described above, as the height of the memory cell array 110 becomes greater, the height of contacts connecting metal interconnections with elements of the page buffer 200 becomes greater. In the page buffer 200 according to an embodiment of the inventive concepts, the first capacitor C1 is disposed or formed by using capacitive coupling of the contacts. Accordingly, the reliability of the latch circuit 25m is improved without providing a separate capacitor or increasing the size of the second transistor TR2.

Figure 5:
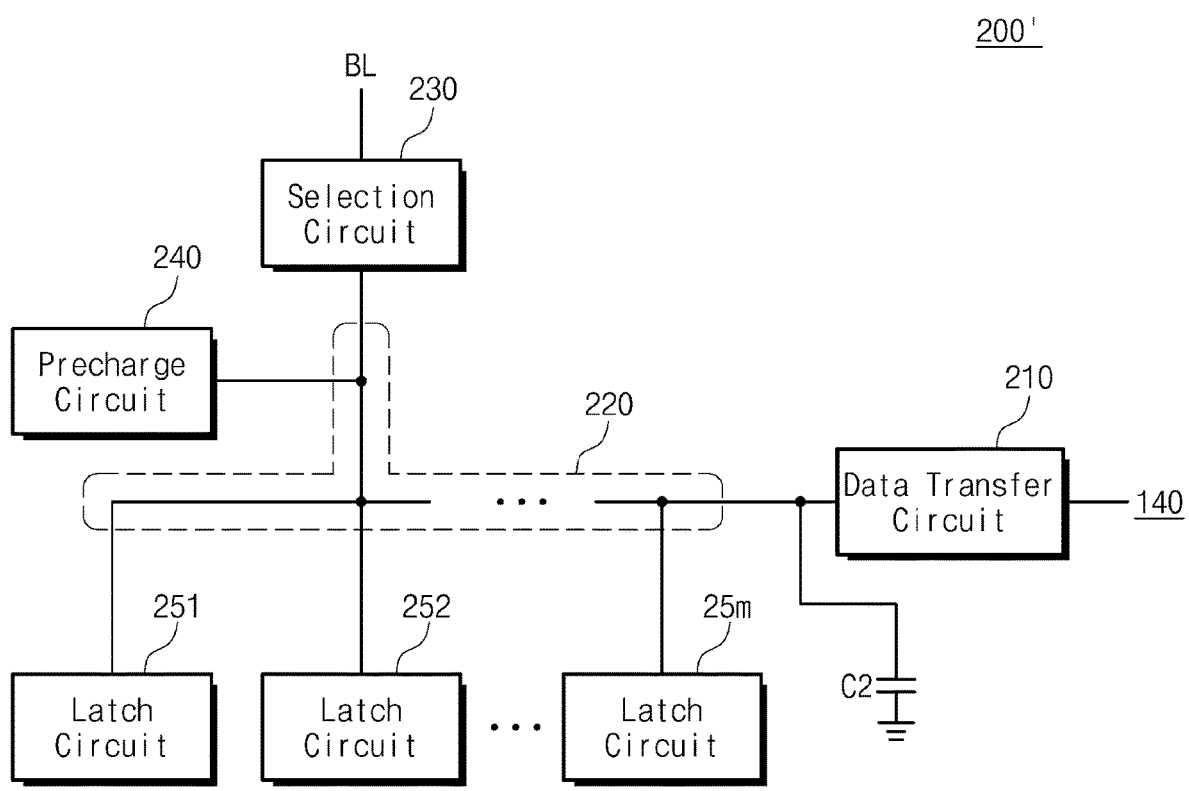
FIG. 5 illustrates another example of the page buffer among the page buffers of FIG. 1.

FIG. 5 illustrates another example of the page buffer 200 among the page buffers PB1 to PBn of FIG. 1. Referring to FIGS. 1 and 5, a page buffer 200' includes the data transfer circuit 210, the sensing node 220, the selection circuit 230, the precharge circuit 240, and the latch circuits 251, 252 to 25m (m being a positive integer greater than "1"). Description of features of FIG. 6 which are similar to features described with respect to FIG. 5 may be omitted from the following.

Compared with FIG. 4, a second capacitor C2 may be connected between the sensing node 220 and the ground node. The second capacitor C2 may increase capacitance of the sensing node 220. If the capacitance of the sensing node 220 increases, a voltage of the sensing node 220 may be unsusceptible to noise and may be stabilized. Accordingly, the reliability of the page buffer 200' may be improved.

As described above, as the height of the memory cell array 110 becomes greater, the height of contacts connecting metal interconnections with elements of the page buffer 200 becomes greater. The page buffer 200' according to an embodiment of the inventive concepts includes the second capacitor C2 formed by using capacitive coupling of the contacts. Accordingly, the reliability of the page buffer 200' is improved without providing a separate capacitor.

Figure 6:
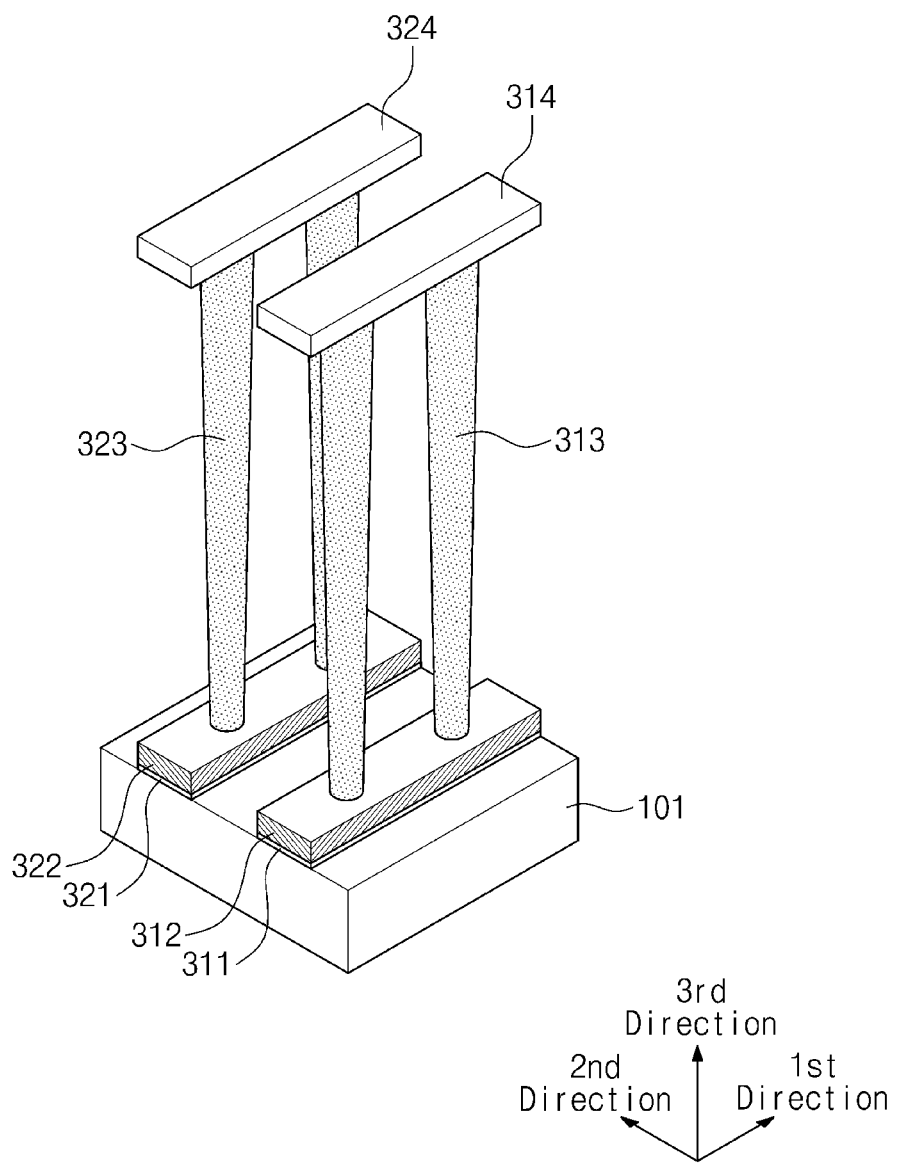
FIG. 6 illustrates a perspective view of an example of a first capacitor or a second capacitor as described with respect to FIGS. 4 and 5.

FIG. 6 illustrates a perspective view of an example of the first capacitor C1 or the second capacitor C2. Referring to FIG. 6, a first insulating material 311 and a second insulating material 321 that extend along the first direction and are spaced apart from each other along the second direction may be provided on the substrate 101. For example, at least one of the first insulating material 311 and the second insulating material 321 may be provided in the form of a trench that burrows into the substrate 101.

The first insulating material 311 and the second insulating material 321 may be disposed in parallel with each other. A first conductive pattern 312 that extends along the first direction is disposed on the first insulating material 311. A second conductive pattern 322 that extends along the first direction is disposed on the second insulating material 321. The first and second conductive patterns 312 and 322 may be spaced apart from each other along the second direction.

The first and second conductive patterns 312 and 322 may be disposed in parallel with each other. For example, the first and second conductive patterns 312 and 322 may include gate patterns. The first and second conductive patterns 312 and 322 may include polysilicon.

A third conductive pattern 314 is provided over the first conductive pattern 312. The first and third conductive patterns 312 and 314 are connected with each other through first contacts 313. A fourth conductive pattern 324 is provided over the second conductive pattern 322. The second and fourth conductive patterns 322 and 324 are connected with each other through second contacts 323. In an embodiment, the first and third conductive patterns 312 and 314 may be connected with each other through more than two first contacts 313, and the second and fourth conductive patterns 322 and 324 may be connected with each other through more than two second contacts 323.

For example, the third and fourth conductive patterns 314 and 324 may be provided as a part of metal interconnections. As the height of the memory cell array 110 (refer to FIGS. 2 and 3) increases, the height of the third and fourth conductive patterns 314 and 324 (in other words the height at which the third and fourth conductive patterns 314 and 324 are located) may increase, and the height of the first and second contacts 313 and 323 may also increase.

Since the first and second contacts 313 and 323 are disposed just adjacent to each other (e.g., no other contacts or elements are disposed therebetween), capacitive coupling is formed between first and second contacts 313 and 323. If the height of the first and second contacts 313 and 323 increases, the area of the first and second contacts 313 and 323 that face each other increases. That is, the capacitive coupling between the first and second contacts 313 and 323 increases. The page buffer 200 or 200' according to an embodiment of the inventive concepts may form the first capacitor C1 or the second capacitor C2 by using the first and second contacts 313 and 323. For example, the third conductive pattern 314 may be connected to the first end of the first transistor TR1 (refer to FIG. 4) or the sensing node 220 (refer to FIG. 5). The fourth conductive pattern 324 may be connected to the ground node. For example, a ground voltage may be fixedly supplied to the fourth conductive pattern 324.

The fourth conductive pattern 324 may be a part of metal interconnections supplying the ground voltage to the page buffer circuit 130 (refer to FIG. 1). The fourth conductive pattern 324 may be a part of metal interconnections used to provide capacitive coupling of a ground voltage and a power supply voltage for stabilization of the ground voltage and the power supply voltage.

In an embodiment, the first to third directions illustrated in FIG. 6 may coincide with or be different from the first to third directions of FIG. 2. The first to third directions are used in respective drawings for the purpose of distinguishing different directions and are not limited to indicate the same directions across all embodiments of the inventive concepts as described with respect to the various figures In an embodiment, the first contacts 313 may have a second height which corresponds to (is substantially the same as) a first height of each of the cell strings CS of the one memory block BLKk shown in FIG. 2. The second contacts 323 may have a third height which corresponds to (is substantially the same as) a first height of each of the cell strings CS of the one memory block BLKk shown in FIG. 2. The second contacts 323 are disposed adjacent the first contacts 313 in an opposite direction of the second direction, and are electrically separate from the first contacts 313.

Figure 7:
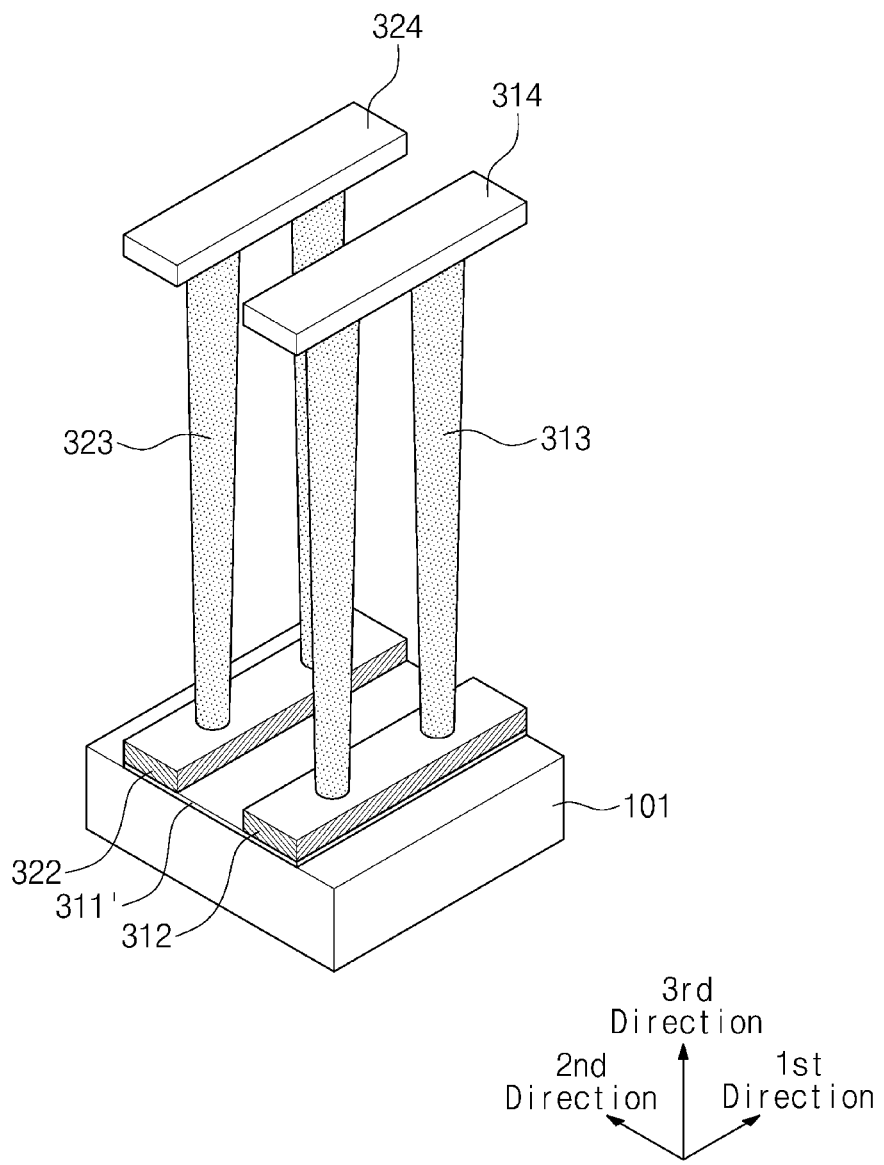
FIG. 7 illustrates an application of the capacitor of FIG. 6.

FIG. 7 illustrates an application of the capacitor C1/C2 of FIG. 6. Description of features of FIG. 7 which are similar to features of FIG. 6 may be omitted from the following. Compared with FIG. 6, an expanded first insulating material 311' is disposed on the substrate 101. The first and second conductive patterns 312 and 322 may be disposed on the expanded first insulating material 311'. The expanded first insulating material 311' may be provided in the form of a trench that burrows into the substrate 101.

Figure 8:
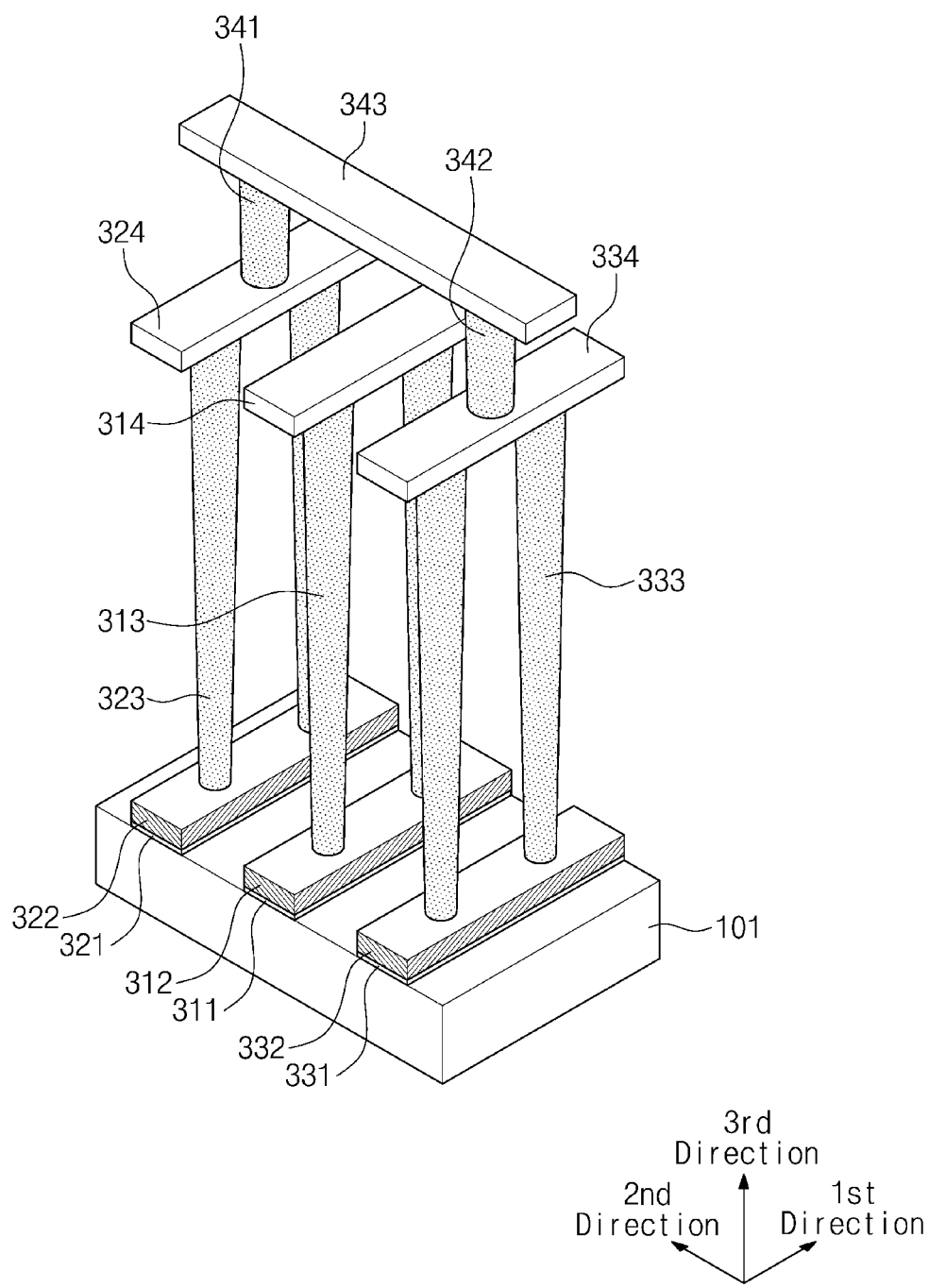
FIG. 8 illustrates an application of the capacitor of FIG. 6.

FIG. 8 illustrates an application of the capacitor C1/C2 of FIG. 6. Description of features of FIG. 8 which are similar to features of FIG. 6 may be omitted from the following. Compared with FIG. 6, a third insulating material 331 is further disposed on the substrate 101. The third insulating material 331 is disposed at (i.e., adjacent to or along) a side of the first insulating material 311 which is opposite of the side of the first insulating material 311 which faces the second insulating material 321.

The third insulating material 331 may extend along the first direction. The third insulating material 331 may be spaced apart from the first insulating material 311 along the second direction. The third insulating material 331 may be provided in the form of a trench that burrows into the substrate 101.

A fifth conductive pattern 332 is disposed on the third insulating material 331. The fifth conductive pattern 332 is disposed at (or adjacent) a side of the first conductive pattern 312 which is opposite of the side of the first conductive pattern 312 which faces the second conductive pattern 322. The fifth conductive pattern 332 may include a gate pattern.

A sixth conductive pattern 334 is provided over the fifth conductive pattern 332. The sixth conductive pattern 334 may have a height (in other words located at a height) corresponding to the height of the memory block BLKk (refer to FIG. 2). The sixth conductive pattern 334 may be a part of metal interconnections. The sixth conductive pattern 334 may be connected with the fifth conductive pattern 332 through third contacts 333.

The third contacts 333 are disposed at (or adjacent) a side (e.g., a first side) of the first contacts 313 which is opposite of the side (e.g., a second side) of the first contacts 313 which faces the second contacts 323. Like the second contacts 323 that form the capacitive coupling with the first contacts 313, the third contacts 333 may form the capacitive coupling with the first contacts 313.

An upper conductive pattern 343 that extends in the second direction is provided over the third conductive pattern 314, the fourth conductive pattern 324, and the sixth conductive pattern 334. The upper conductive pattern 343 is connected to the fourth conductive pattern 324 through a first upper contact 341, and is connected to the sixth conductive pattern 334 through a second upper contact 342.

That is, the capacitance between the first contacts 313 and the second contacts 323, and the capacitance between the first contacts 313 and the third contacts 333, may be coupled by the upper conductive pattern 343. Accordingly, the capacitance of the capacitor C1/C2 may further increase. In an embodiment, the second contacts 323 disposed adjacent to the first contacts 313 may provide (or be) an electromagnetic shield for the first contacts 313.

Likewise, the third contacts 333 disposed adjacent to the first contacts 313 may provide (or be) an electromagnetic shield for the first contacts 313. Accordingly, a voltage change or an environment noise of another contact or another conductive pattern around the first contacts 313 may be prevented from being transferred to the first contacts 313, and the reliability of the latch circuit 25m (refer to FIG. 4) or the sensing node 220 (refer to FIG. 5) may be improved.

In an embodiment, similarly as described with reference to FIG. 7, the first conductive pattern 312, the second conductive pattern 322, and the fifth conductive pattern 332 may be formed on an expanded first insulating material such as expanded first insulating material 311' shown in FIG. 7. The expanded first insulating material may be provided in the form of a trench that burrows into the substrate 101.

Figure 9:
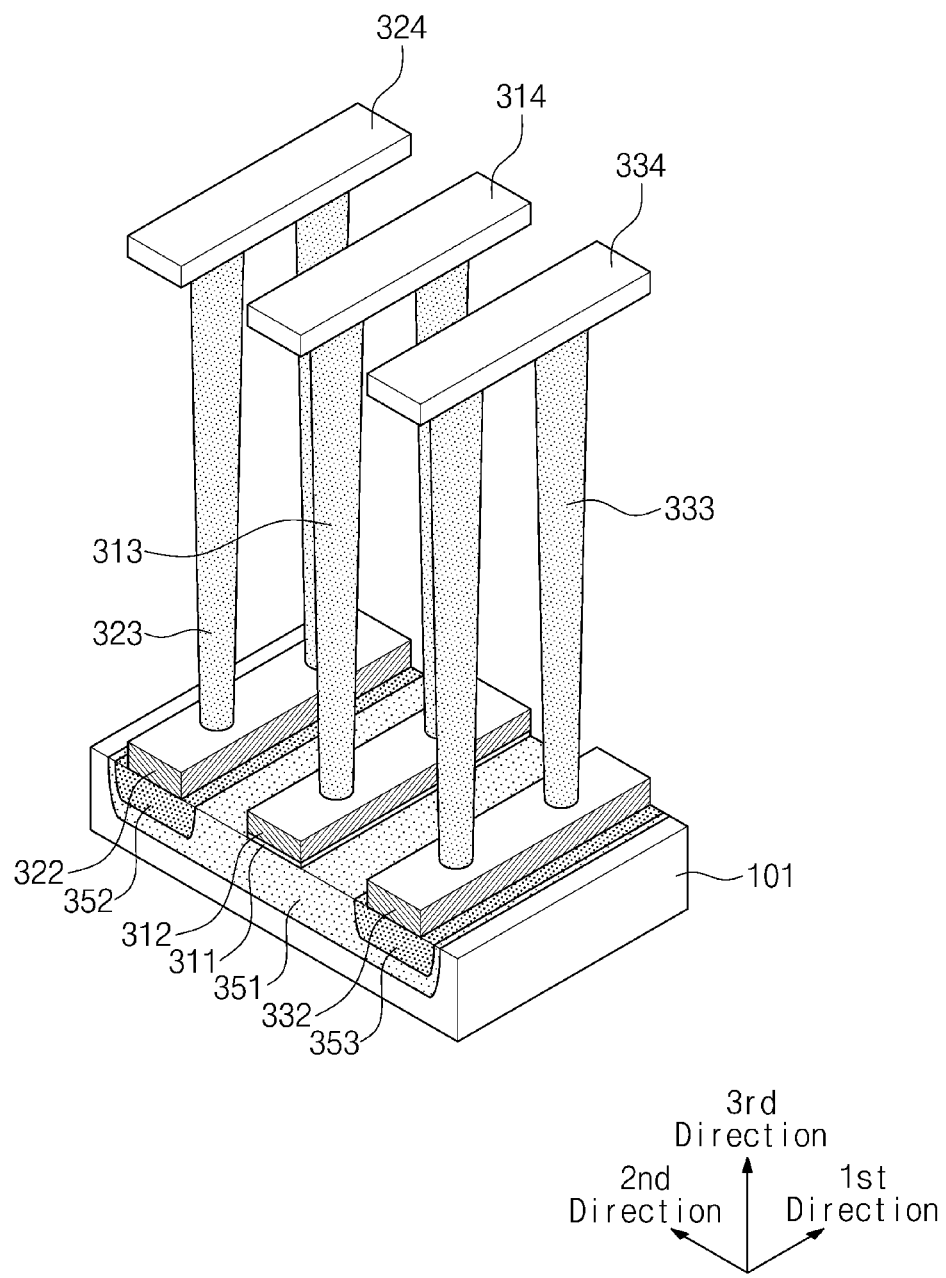
FIG. 9 illustrates an application of the capacitor of FIG. 8.

FIG. 9 illustrates an application of the capacitor C1/C2 of FIG. 8. Description of features of FIG. 9 which are similar to features of FIG. 8 may be omitted from the following. Compared with FIG. 8, the second contacts 323 and the third contacts 333 are connected with each other through a junction (e.g., implanted region) 351, instead of through the upper conductive pattern 343 as shown in FIG. 8. In detail, the junction 351 is formed in the substrate 101. The second conductive pattern 322 is disposed on the junction 351 and the second insulating material 321 is omitted. A deep junction (e.g., implanted region) 352 having a higher doping concentration than the junction 351 may be formed in a portion of the junction 351 corresponding to the second conductive pattern 322.

The fifth conductive pattern 332 is disposed on the junction 351 and the third insulating material 331 is omitted. A deep junction 353 having a higher doping concentration than the junction 351 may be formed in a portion of the junction (e.g., implanted region) 351 corresponding to the fifth conductive pattern 332. For example, the second conductive pattern 322 and/or the fifth conductive pattern 332 may include metal silicide formed on a gate pattern or the junction 351.

The first conductive pattern 312 is electrically separated from the junction 351 by the first insulating material 311. Accordingly, the first contacts 313 may form a capacitor C1/C2 with the second contacts 323 and the third contacts 333.

Figure 10:
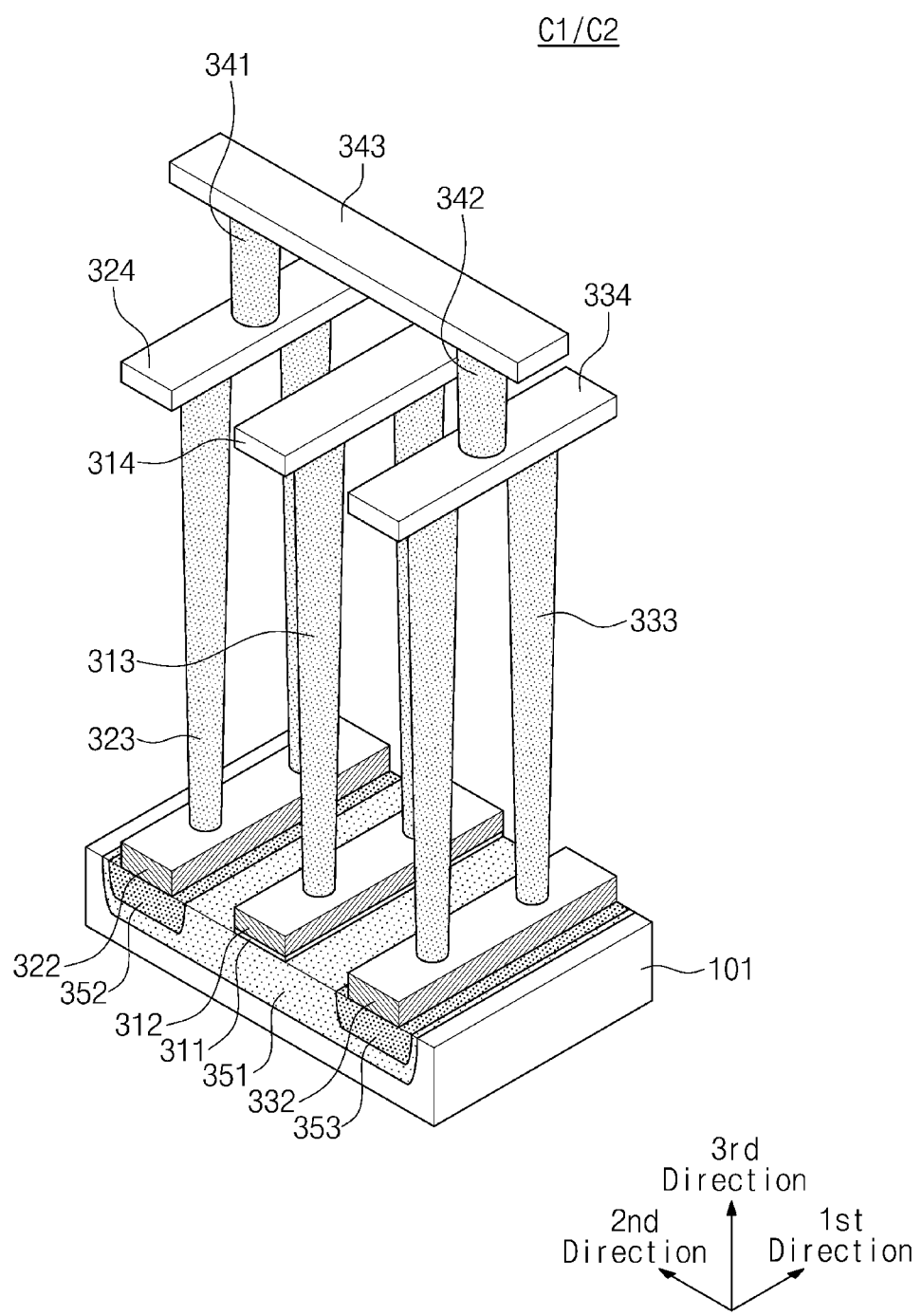
FIG. 10 illustrates an application in which the embodiments of FIGS. 8 and 9 are combined.

FIG. 10 illustrates an application in which the examples of FIGS. 8 and 9 are combined. Description of features of FIG. 10 which are similar to features of FIGS. 8 and 9 may be omitted from the following. Referring to FIG. 10, the second contacts 323 and the third contacts 333 are electrically connected with each other through the upper conductive pattern 343 as described with reference to FIG. 8. Also, the second contacts 323 and the third contacts 333 are electrically connected with each other through the junction 351 as described with reference to FIG. 9.

Figure 11:
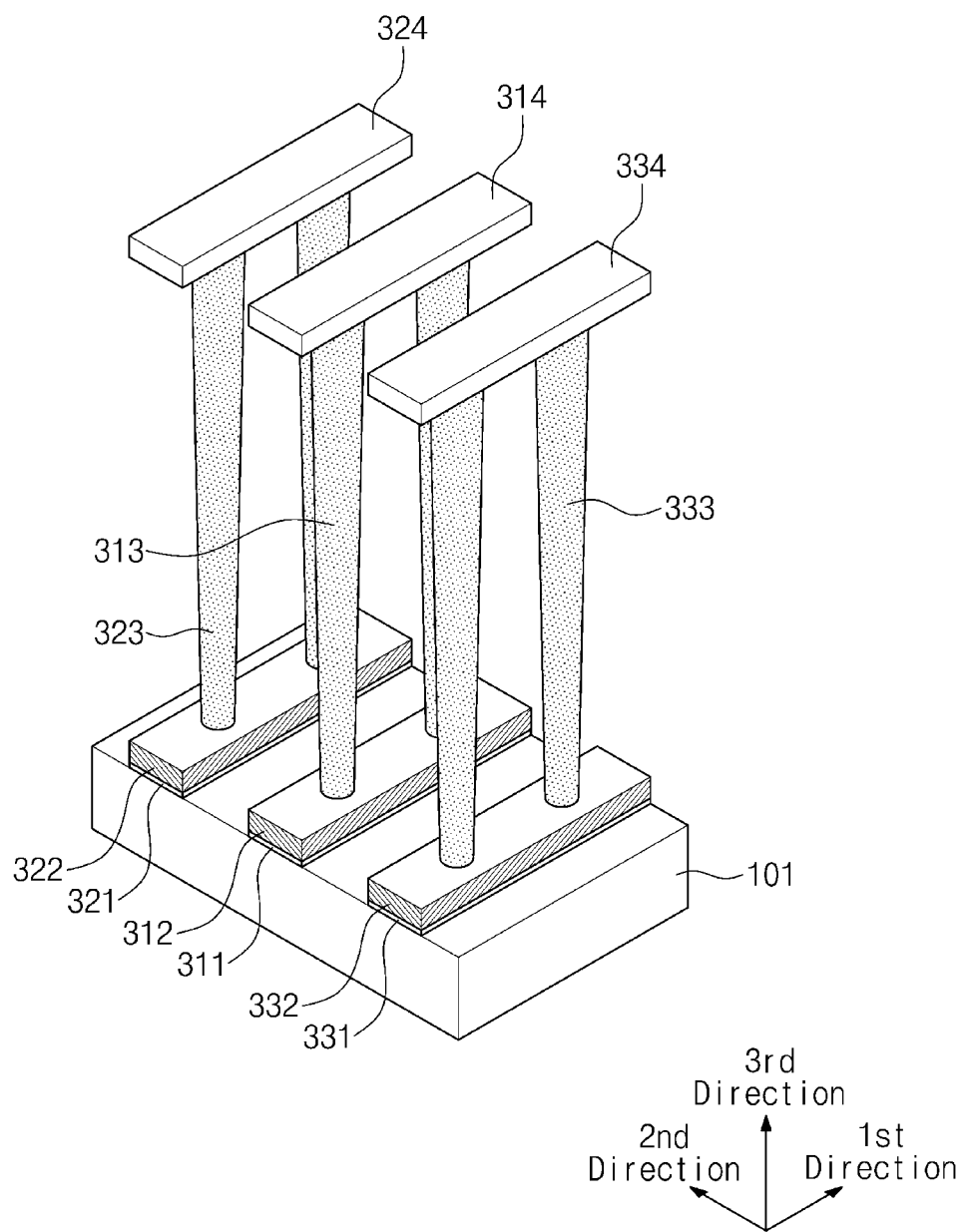
FIG. 11 illustrates an application of examples of FIGS. 8 to 10.

FIG. 11 illustrates an application of examples of FIGS. 8 to 10. Description of features of FIG. 11 which are similar to features of FIGS. 8 to 10 may be omitted from the following. Referring to FIG. 11, the second contacts 323 and the third contacts 333 are not electrically connected with each other, unlike the embodiments as described with reference to FIGS. 8 to 10. If a constant voltage is supplied to the second contacts 323 and the third contacts 333, the first contacts 313 may form the capacitive coupling with the second contacts 323, and may form the capacitive coupling with the third contacts 333.

The capacitive couplings may overlap each other at the first contacts 313, thereby increasing the capacitance of the first capacitor C1 of the latch circuit 25m (refer to FIG. 4) or the capacitance of the second capacitor C2 of the sensing node 220 (refer to FIG. 5). In an embodiment, a ground voltage or a power supply voltage may be fixedly supplied to the second contacts 323. In this case, the power supply voltage or the ground voltage may be fixedly supplied to the third contacts 333.

The fourth conductive pattern 324 may be a part of metal interconnections supplying the ground voltage or the power supply voltage to the page buffer circuit 130 (refer to FIG. 1). The fourth conductive pattern 324 may be a part of metal interconnections used to provide the capacitive coupling of the ground voltage and the power supply voltage for stabilization of the ground voltage and the power supply voltage.

The sixth conductive pattern 334 may be a part of metal interconnections supplying the ground voltage or the power supply voltage to the page buffer circuit 130 (refer to FIG. 1). The sixth conductive pattern 334 may be a part of metal interconnections used to provide the capacitive coupling of the ground voltage and the power supply voltage for stabilization of the ground voltage and the power supply voltage.

Figure 12:
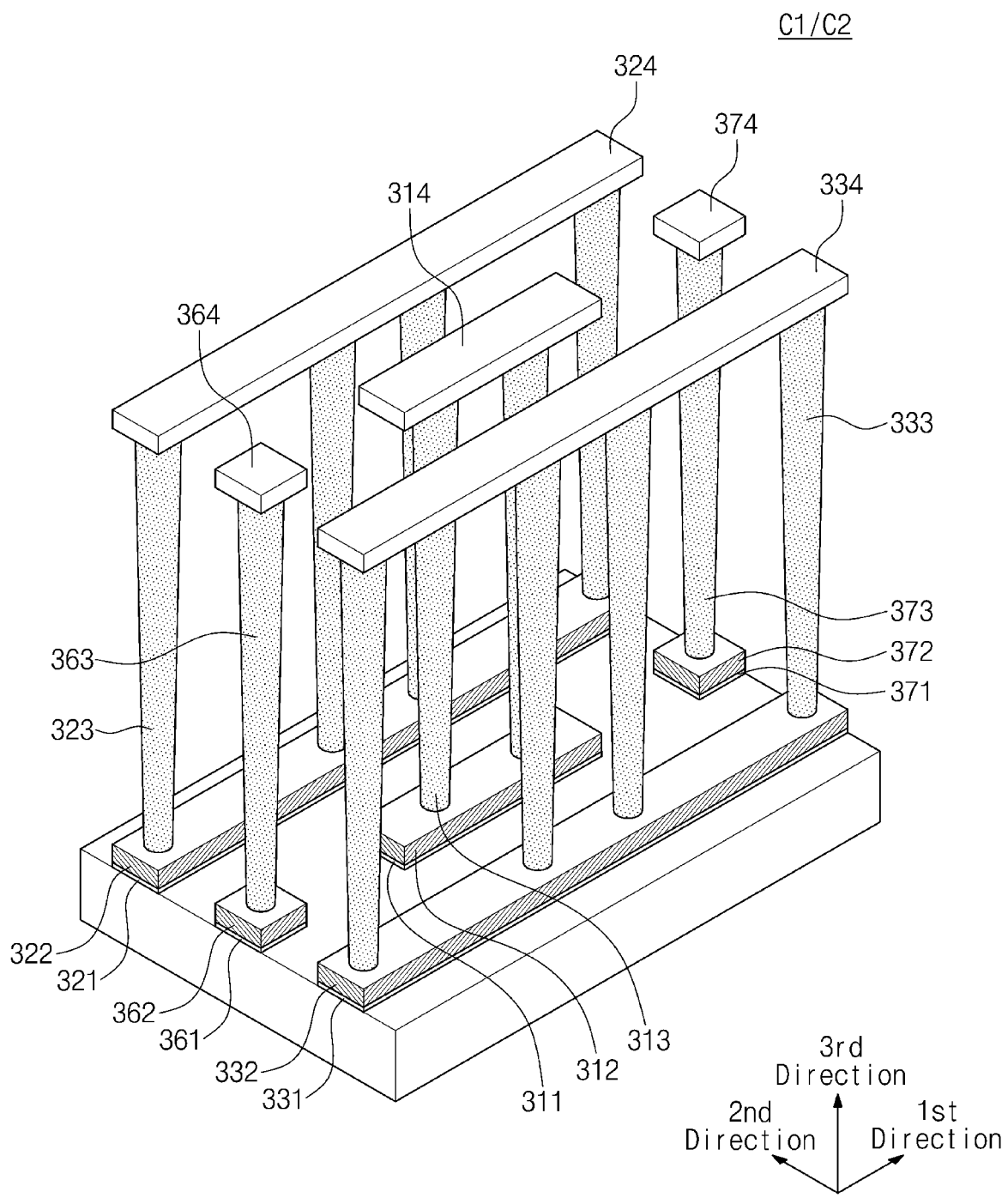
FIG. 12 illustrates an application of the capacitor of FIG. 11.

FIG. 12 illustrates an application of the capacitor C1/C2 of FIG. 11. Description of features of FIG. 12 which are similar to features of FIG. 11 may be omitted from the following. Referring to FIG. 12, a fourth contact 363 and a fifth contact 373 are respectively disposed at (or adjacent) sides of the first contacts 313 other than sides of the first contacts 313 at which the second contacts 323 and the third contacts 333 are disposed. In detail, a fourth insulating material 361 is disposed at a location spaced apart from the first insulating material 311 in a direction that is opposite to the first direction.

A seventh conductive pattern 362 is disposed on the fourth insulating material 361. The seventh conductive pattern 362 may include a gate pattern. An eighth conductive pattern 364 is provided over the seventh conductive pattern 362. The eighth conductive pattern 364 may be a part of metal interconnections. The eighth conductive pattern 364 is connected to the seventh conductive pattern 362 through the fourth contact 363.

A fifth insulating material 371 is disposed at a location spaced apart from the first insulating material 311 along the first direction. A ninth conductive pattern 372 is disposed on the fifth insulating material 371. The ninth conductive pattern 372 may include a gate pattern. A tenth conductive pattern 374 is provided over the ninth conductive pattern 372. The tenth conductive pattern 374 may be a part of metal interconnections. The tenth conductive pattern 374 is connected to the ninth conductive pattern 372 through fifth contact 373.

The second contacts 323 are disposed along the first direction from a location corresponding to the fourth contact 363 to a location corresponding to the fifth contact 373. Depending on the arrangement of the second contacts 323, the second insulating material 321, the second conductive pattern 322, and the fourth conductive pattern 324 may be disposed along the first direction from the location corresponding to the fourth contact 363 to the location corresponding to the fifth contact 373.

The third contacts 333 are disposed along the first direction from the location corresponding to the fourth contact 363 to the location corresponding to the fifth contact 373. Depending on the arrangement of the third contacts 333, the third insulating material 331, the fifth conductive pattern 332, and the sixth conductive pattern 334 may be disposed along the first direction from the location corresponding to the fourth contact 363 to the location corresponding to the fifth contact 373.

In an embodiment, the fourth conductive pattern 324 may be a part of metal interconnections supplying the ground voltage or the power supply voltage to the page buffer circuit 130 (refer to FIG. 1). The fourth conductive pattern 324 may be a part of metal interconnections used to provide the capacitive coupling of the ground voltage and the power supply voltage for stabilization of the ground voltage and the power supply voltage.

The sixth conductive pattern 334 may be a part of metal interconnections supplying the ground voltage or the power supply voltage to the page buffer circuit 130 (refer to FIG. 1). The sixth conductive pattern 334 may be a part of metal interconnections used to provide the capacitive coupling of the ground voltage and the power supply voltage for stabilization of the ground voltage and the power supply voltage.

The second contacts 323 and the third contacts 333 may provide (or be) an electromagnetic shield for the first contacts 313 in the second direction and a direction opposite to the second direction. The fourth contact 363 and the fifth contact 373 may provide (or be) an electromagnetic shield for the first contacts 313 in the first direction and a direction opposite to the first direction. Accordingly, the reliability of the latch circuit 25$m$ (refer to FIG. 4) or the sensing node 220 (refer to FIG. 5) to which the first contacts 313 are connected may be improved.

When a constant voltage is fixedly supplied to the fourth contact 363 or the fifth contact 373, the fourth contact 363 or the fifth contact 373 may provide the capacitive coupling with the first contacts 313. In this case, since the capacitance of the first capacitor C1 or the second capacitor C2 increases, the reliability of the latch circuit 25$m$ or the sensing node 220 may also be improved.

In an embodiment, similarly as described with reference to FIG. 8, at least two of the fourth conductive pattern 324, the sixth conductive pattern 334, the eighth conductive pattern 364, and the tenth conductive pattern 374 may be electrically connected through an upper conductive pattern such as upper conductive pattern 343 shown in FIG. 8. Upper contacts may be provided for conductive patterns connected through the upper conductive pattern.

In an embodiment, similarly as described with reference to FIG. 9, at least two of the second conductive pattern 322, the fifth conductive pattern 332, the seventh conductive pattern 362, and the ninth conductive pattern 372 may be electrically connected through a junction such as junction 351 shown in FIG. 9. Insulating materials associated with the conductive patterns connected through the junction may be removed.

Figure 13:
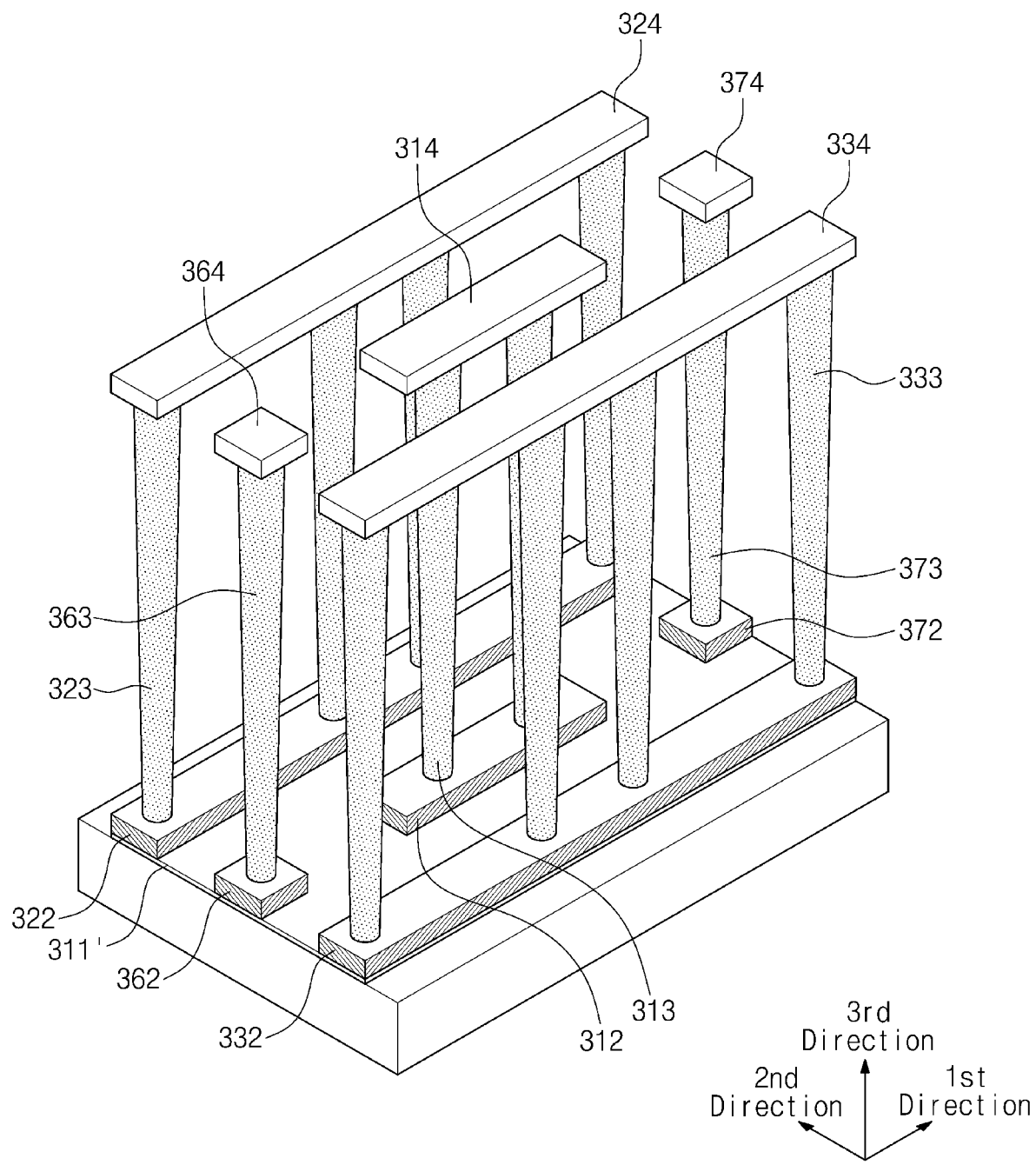
FIG. 13 illustrates an application of the capacitor of FIG. 12.

FIG. 13 illustrates an application of the capacitor C1/C2 of FIG. 12. Description of features of FIG. 13 which are similar to features of FIG. 12 may be omitted from the following. Compared with FIG. 12, the first conductive pattern 312, the second conductive pattern 322, the fifth conductive pattern 332, the seventh conductive pattern 362, and the ninth conductive pattern 372 are formed on the expanded first insulating material 311'. The expanded first insulating material 311' may be provided in the form of a trench that burrows into the substrate 101.

In an embodiment, similarly as described with reference to FIG. 8, at least two of the fourth conductive pattern 324, the sixth conductive pattern 334, the eighth conductive pattern 364, and the tenth conductive pattern 374 may be electrically connected through an upper conductive pattern such as upper conductive pattern 343 shown in FIG. 8. Upper contacts may be provided for conductive patterns connected through the upper conductive pattern.

Figure 14:
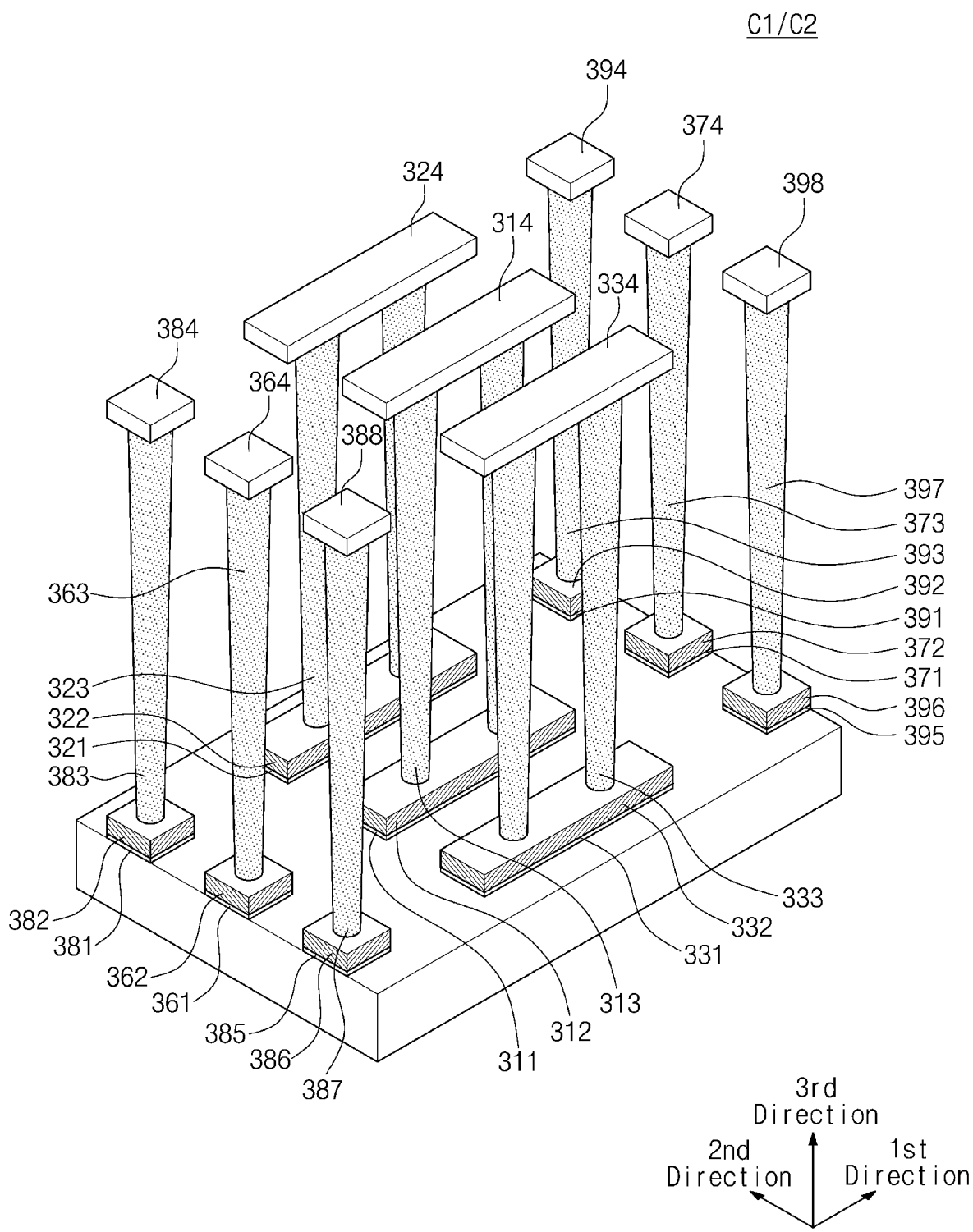
FIG. 14 illustrates an application of the capacitor of FIG. 12.

FIG. 14 illustrates an application of the capacitor C1/C2 of FIG. 12. Description of features of FIG. 14 which are similar to features of FIG. 12 may be omitted from the following. Referring to FIG. 14, a sixth contact 383, a seventh contact 387, an eighth contact 393, and a ninth contact 397 are respectively disposed at locations corresponding to corners of the first contacts 313 in diagonal directions. In detail, a sixth insulating material 381 is disposed at a location of a diagonal line, which is spaced apart from the first insulating material 311 along the second direction and a direction that is opposite to the first direction.

An eleventh conductive pattern 382 is disposed on the sixth insulating material 381. The eleventh conductive pattern 382 may include a gate pattern. A twelfth conductive pattern 384 is provided over the eleventh conductive pattern 382. The twelfth conductive pattern 384 may be a part of metal interconnections. The twelfth conductive pattern 384 is connected to the eleventh conductive pattern 382 through the sixth contact 383.

A seventh insulating material 385 is disposed at a location of a diagonal line, which is spaced apart from the first insulating material 311 along the opposite direction to the first direction and a direction that is opposite to the second direction. A thirteenth conductive pattern 386 is disposed on the seventh insulating material 385. The thirteenth conductive pattern 386 may include a gate pattern. A fourteenth conductive pattern 388 is provided over the thirteenth conductive pattern 386. The fourteenth conductive pattern 388 may be a part of metal interconnections. The fourteenth conductive pattern 388 is connected to the thirteenth conductive pattern 386 through the seventh contact 387.

An eighth insulating material 391 is disposed at a location of a diagonal line, which is spaced apart from the first insulating material 311 along the first direction and the second direction. A fifteenth conductive pattern 392 is disposed on the eighth insulating material 391. The fifteenth conductive pattern 392 may include a gate pattern. A sixteenth conductive pattern 394 is provided over the fifteenth conductive pattern 392. The sixteenth conductive pattern 394 may be a part of metal interconnections. The sixteenth conductive pattern 394 is connected to the fifteenth conductive pattern 392 through the eighth contact 393.

A ninth insulating material 395 is disposed at a location of a diagonal line, which is spaced apart from the first insulating material 311 along the first direction and the opposite direction to the second direction. A seventeenth conductive pattern 396 is disposed on the ninth insulating material 395. The seventeenth conductive pattern 396 may include a gate pattern. An eighteenth conductive pattern 398 is provided over the seventeenth conductive pattern 396. The eighteenth conductive pattern 398 may be a part of metal interconnections. The eighteenth conductive pattern 398 is connected to the seventeenth conductive pattern 396 through the ninth contact 397.

The second contacts 323 are disposed in an area which is separated along the second direction from an area where the first contacts 313 are disposed. The third contacts 333 are disposed in an area which is separated along the direction opposite to the second direction from an area where the first contacts 313 are disposed.

In an embodiment, the fourth conductive pattern 324 or the sixth conductive pattern 334 may be a part of metal interconnections supplying the ground voltage or the power supply voltage to the page buffer circuit 130 (refer to FIG. 1). The fourth conductive pattern 324 or the sixth conductive pattern 334 may be a part of metal interconnections used to provide the capacitive coupling of the ground voltage and the power supply voltage for stabilization of the ground voltage and the power supply voltage.

The second contacts 323 and the third contacts 333 may provide (or be) an electromagnetic shield for the first contacts 313 in the second direction and a direction opposite to the second direction. The fourth contact 363 and the fifth contact 373 may provide (or be) an electromagnetic shield for the first contacts 313 in the first direction and a direction opposite to the first direction. The sixth, seventh, eighth, and ninth contacts 383, 387, 393, and 397 may provide (or be) an electromagnetic shield for the first contacts 313 in diagonal directions between the first direction and the second direction. Accordingly, the reliability of the latch circuit 25m (refer to FIG. 4) or the sensing node 220 (refer to FIG. 5) to which the first contacts 313 are connected may be improved.

When a constant voltage is fixedly supplied to the fourth contact 363, the fifth contact 373, the sixth contact 383, the seventh contact 387, the eighth contact 393, or the ninth contact 397, the fourth contact 363, the fifth contact 373, the sixth contact 383, the seventh contact 387, the eighth contact 393, or the ninth contact 397 may provide the capacitive coupling with the first contacts 313. In this case, since the capacitance of the first capacitor C1 or the second capacitor C2 increases, the reliability of the latch circuit 25m or the sensing node 220 may also be improved.

In an embodiment, similarly as described with reference to FIG. 8, at least two of the fourth conductive pattern 324, the sixth conductive pattern 334, the eighth conductive pattern 364, the tenth conductive pattern 374, the twelfth conductive pattern 384, the fourteenth conductive pattern 388, the sixteenth conductive pattern 394, and the eighteenth conductive pattern 398 may be electrically connected through an upper conductive pattern such as upper conductive pattern 343 shown in FIG. 8. Upper contacts may be provided for conductive patterns connected through the upper conductive pattern.

In an embodiment, similarly as described with reference to FIG. 9, at least two of the fourth conductive pattern 324, the sixth conductive pattern 334, the eighth conductive pattern 364, the tenth conductive pattern 374, the twelfth conductive pattern 384, the fourteenth conductive pattern 388, the sixteenth conductive pattern 394, and the eighteenth conductive pattern 398 may be electrically connected through a junction such as junction 351 shown in FIG. 9. Insulating materials (such as first insulating material 311 for example) associated with the conductive patterns connected through the junction may be removed.

In an embodiment, similarly as described with reference to FIG. 13, the first conductive pattern 312, the second conductive pattern 322, the fifth conductive pattern 332, the seventh conductive pattern 362, the ninth conductive pattern 372, the eleventh conductive pattern 382, the thirteenth conductive pattern 386, the fifteenth conductive pattern 392, and the seventeenth conductive pattern 396 may be disposed on an expanded first insulating material such as the expanded first insulating material 311' shown in FIG. 13. The expanded first insulating material may be provided in the form of a trench that burrows into the substrate 101.

Figure 15:
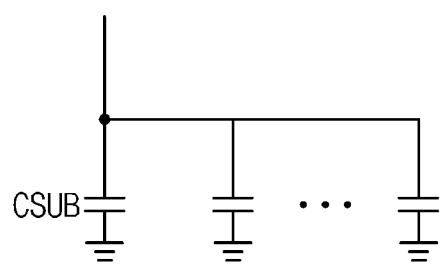
FIG. 15 illustrates an embodiment where the capacitor is distributed and disposed.

FIG. 15 illustrates an example where the capacitor C1/C2 is distributed and disposed. Referring to FIG. 15, the capacitor C1/C2 may be implemented in the form where a plurality of sub capacitors CSUB are connected in parallel. The capacitance of the capacitor C1/C2 may correspond to a sum of capacitances of the sub capacitors CSUB.

Each of the sub capacitors CSUB may have a structure such as any one of the structures described with reference to FIGS. 6 to 14. The structures described with reference to FIGS. 6 to 14 may be disposed in plural number, and the disposed structures may be connected in parallel to form the capacitor C1/C2. If the capacitor C1/C2 is disposed in such a way that the capacitor C1/C2 is distributed as the plurality of sub capacitors CSUB, a necessary value of the capacitance of the capacitor C1/C2 may be secured without limiting the layout of the page buffer 200 or 200'.

For example, at least one of the sub capacitors CSUB may be included in the layout of the page buffer 200 or 200', and the remaining sub capacitors CSUB may be disposed outside the layout of the page buffer 200 or 200'. As another example, the sub capacitors CSUB may be disposed outside the layout of the page buffer 200 or 200' and may be connected to a corresponding element of the page buffer 200 or 200' through metal interconnections.

Figure 16:
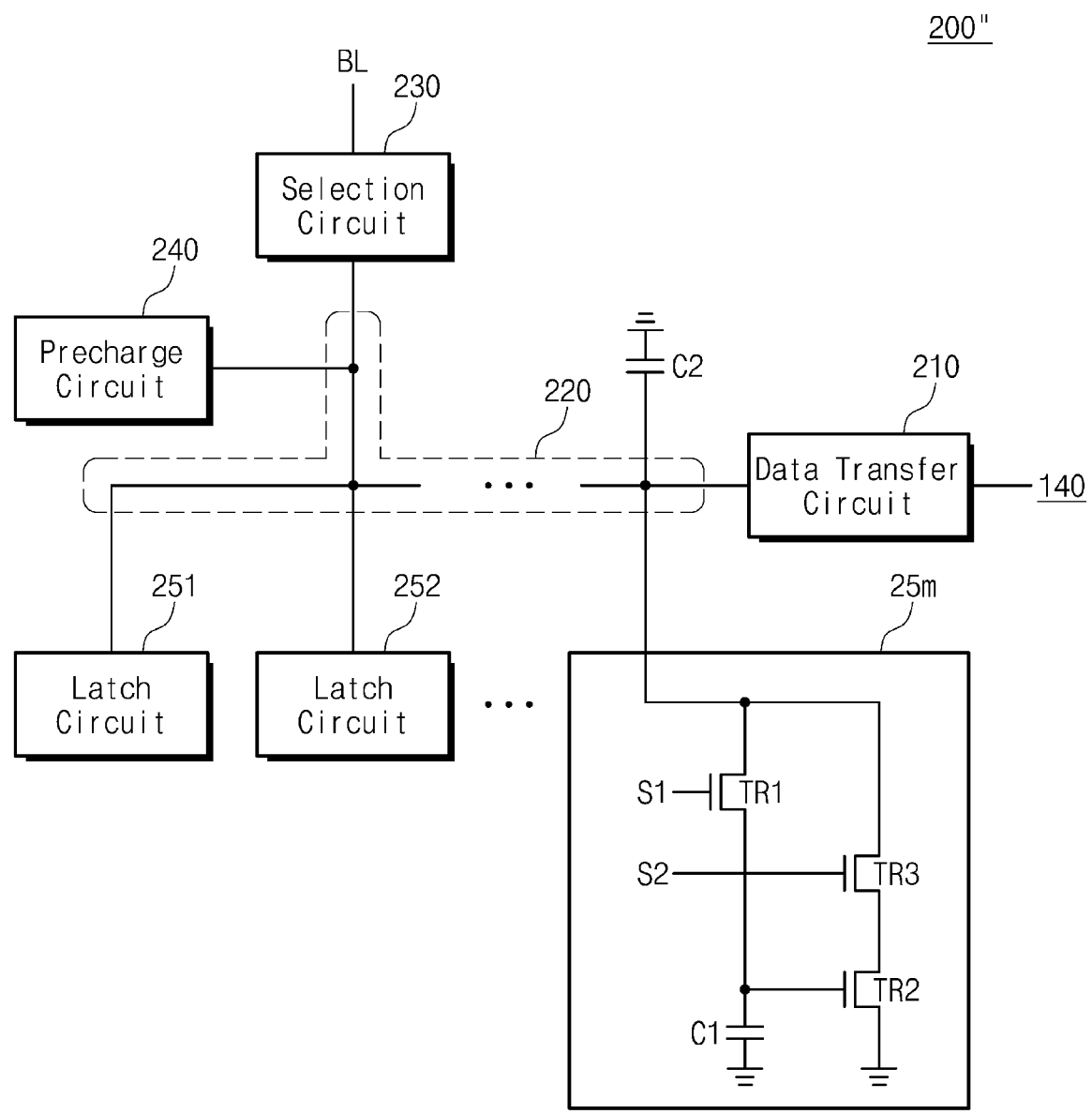
FIG. 16 illustrates an embodiment of a page buffer corresponding to a combination of FIGS. 4 and 5.

FIG. 16 illustrates an example of a page buffer 200" corresponding to a combination of FIGS. 4 and 5. Description of features of FIG. 16 which are similar to features of FIGS. 4 and 5 may be omitted from the following. Referring to FIGS. 1 and 16, the page buffer 200" includes the data transfer circuit 210, the sensing node 220, the selection circuit 230, the precharge circuit 240, and the latch circuits 251, 252 to 25m (m being a positive integer greater than "1").

As described with reference to FIG. 4, the latch circuit 25m includes the first to third transistors TR1 to TR3 and the first capacitor C1. The second capacitor C2 is connected to the sensing node 220. The first capacitor C1 may improve the reliability of the latch circuit 25m.

The second capacitor C2 may allow the sensing node 220 to become less susceptible to noise and coupling. Accordingly, the reliability of the page buffer 200" and the nonvolatile memory device 100 (refer to FIG. 1) including the page buffer 200" may be improved by the first and second capacitors C1 and C2.

According to an embodiment of the inventive concepts, a nonvolatile memory device including a capacitor that is based on contacts is provided. Accordingly, the increased capacitance may allow the reliability of the nonvolatile memory device to be improved.

While the inventive concepts have been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
a memory cell array formed in a first area of a substrate; and
a page buffer circuit formed in a second area of the substrate and connected to the memory cell array through bit lines,
wherein the memory cell array comprises cell strings, each of the cell strings comprising nonvolatile memory cells stacked in a direction perpendicular to the substrate,
wherein the page buffer circuit comprises page buffers respectively corresponding to the bit lines,
wherein each of the page buffers comprises
latches connected to a sensing node, and
a selection circuit configured to selectively connect the sensing node to a corresponding bit line of the bit lines,
wherein at least one latch of the latches comprises a capacitor configured to selectively store a voltage of the sensing node,
wherein the capacitor comprises
at least one first contact to which the voltage of the sensing node is selectively supplied, the at least one first contact having a second height corresponding to a first height of each of the cell strings, and
at least one second contact to which a ground voltage is supplied, the at least one second contact having a third height corresponding to the first height, disposed adjacent to the at least one first contact, and electrically separated from the at least one first contact,
wherein the at least one first contact includes two or more first contacts, and the capacitor further comprises a conductive pattern connecting the two or more first contacts, and
wherein the conductive pattern is disposed on upper surfaces of the two or more first contacts.

2. The nonvolatile memory device of claim 1, wherein the conductive pattern, and an insulating material insulating the conductive pattern from the substrate, are disposed between lower surfaces of the two or more first contacts and the substrate.

3. A nonvolatile memory device comprising:
a memory cell array formed in a first area of a substrate; and
a page buffer circuit formed in a second area of the substrate and connected to the memory cell array through bit lines,
wherein the memory cell array comprises cell strings, each of the cell strings comprising nonvolatile memory cells stacked in a direction perpendicular to the substrate,
wherein the page buffer circuit comprises page buffers respectively corresponding to the bit lines,
wherein each of the page buffers comprises
latches connected to a sensing node, and
a selection circuit configured to selectively connect the sensing node to a corresponding bit line of the bit lines,
wherein at least one latch of the latches comprises a capacitor configured to selectively store a voltage of the sensing node,
wherein the capacitor comprises
at least one first contact to which the voltage of the sensing node is selectively supplied, the at least one first contact having a second height corresponding to a first height of each of the cell strings, and
at least one second contact to which a ground voltage is supplied, the at least one second contact having a third height corresponding to the first height, disposed adjacent to the at least one first contact, and electrically separated from the at least one first contact,
wherein the at least one first contact includes two or more first contacts, and the capacitor further comprises a conductive pattern connecting the two or more first contacts,
wherein the at least one second contact includes two or more second contacts,
wherein a first conductive pattern connecting the two or more second contacts is disposed on upper surfaces of the two or more second contacts, and
wherein a second conductive pattern connecting the two or more second contacts, and an insulating material insulating the second conductive pattern from the substrate, are disposed between lower surfaces of the two or more second contacts and the substrate.

4. The nonvolatile memory device of claim 1, wherein the capacitor further comprises:
at least one third contact disposed at a first side of the at least one first contact, which is opposite to a second side of the at least one first contact which faces the at least one second contact.

5. A nonvolatile memory device comprising:
a memory cell array formed in a first area of a substrate; and
a page buffer circuit formed in a second area of the substrate and connected to the memory cell array through bit lines,
wherein the memory cell array comprises cell strings, each of the cell strings comprising nonvolatile memory cells stacked in a direction perpendicular to the substrate,
wherein the page buffer circuit comprises page buffers respectively corresponding to the bit lines,
wherein each of the page buffers comprises
latches connected to a sensing node, and
a selection circuit configured to selectively connect the sensing node to a corresponding bit line of the bit lines,
wherein at least one latch of the latches comprises a capacitor configured to selectively store a voltage of the sensing node,
wherein the capacitor comprises at least one first contact to which the voltage of the sensing node is selectively supplied, the at least one first contact having a second height corresponding to a first height of each of the cell strings, and at least one second contact to which a ground voltage is supplied, the at least one second contact having a third height corresponding to the first height, disposed adjacent to the at least one first contact, and electrically separated from the at least one first contact, wherein the at least one first contact includes two or more first contacts, and the capacitor further comprises a conductive pattern connecting the two or more first contacts, wherein the capacitor further comprises at least one third contact disposed at a first side of the at least one first contact, which is opposite to a second side of the at least one first contact which faces the at least one second contact, and wherein another conductive pattern connecting the at least one second contact and the at least one third contact is disposed over the at least one first contact, the at least one second contact, and the at least one third contact.

6. The nonvolatile memory device of claim 4, wherein a first junction electrically connecting the at least one second contact and the at least one third contact is disposed in the substrate, and wherein the at least one first contact is disposed on an insulating material disposed on the first junction.

7. The nonvolatile memory device of claim 6, wherein second junctions having a doping concentration higher than a doping concentration of the first junction are respectively disposed in a first portion of the first junction, which is in contact with the at least one second contact, and in a second portion of the first junction which is in contact with the at least one third contact.

8. The nonvolatile memory device of claim 4, wherein the at least one third contact is connected to another conductive pattern configured to supply power to the latches of each of the page buffers.

9. The nonvolatile memory device of claim 4, wherein the capacitor further comprises at least one fourth contact and at least one fifth contact disposed at respective sides of the at least one first contact other than the first and second sides of the at least one first contact.

10. The nonvolatile memory device of claim 9, wherein the at least one second contact comprises:

two or more second contacts disposed in line from a first location close to a location where the at least one fourth contact is disposed, to a second location adjacent to a location where the at least one fifth contact is disposed.

11. The nonvolatile memory device of claim 9, wherein the capacitor further comprises at least one sixth contact, at least one seventh contact, at least one eighth contact, and at least one ninth contact respectively disposed at locations corresponding to corners of the at least one first contact in diagonal directions.

* * * * *